US008933718B2

(12) United States Patent
Laquai

(10) Patent No.: US 8,933,718 B2
(45) Date of Patent: Jan. 13, 2015

(54) SIGNAL DISTRIBUTION STRUCTURE AND METHOD FOR DISTRIBUTING A SIGNAL

(75) Inventor: Bernd Laquai, Stuttgart (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 807 days.

(21) Appl. No.: 13/120,157

(22) PCT Filed: Sep. 19, 2008

(86) PCT No.: PCT/EP2008/007913

§ 371 (c)(1), (2), (4) Date: Apr. 26, 2011

(87) PCT Pub. No.: WO2010/031418

PCT Pub. Date: Mar. 25, 2010

(65) Prior Publication Data

US 2011/0187399 A1 Aug. 4, 2011

(51) Int. Cl.

| | |
|---|---|
| ***G01R 31/02*** | (2006.01) |
| ***G01R 31/08*** | (2006.01) |
| ***H01P 5/12*** | (2006.01) |
| ***H01P 5/02*** | (2006.01) |
| *G01R 27/02* | (2006.01) |

(52) U.S. Cl.

CPC ... *H01P 5/12* (2013.01); *H01P 5/02* (2013.01)
USPC . 324/756.01; 324/629; 324/649; 324/756.05; 324/756.06

(58) Field of Classification Search

CPC ................. G01R 27/205; G01R 31/025–31/08
USPC .................. 324/753–762.06, 756.01–762.09; 702/108–126
See application file for complete search history.

(56) References Cited

U.S. PATENT DOCUMENTS

| | | | | |
|---|---|---|---|---|
| 4,646,038 | A | 2/1987 | Wanat | |
| 4,893,093 | A | 1/1990 | Cronauer et al. | |
| 6,759,854 | B2 * | 7/2004 | Logisch | 324/629 |
| 7,355,414 | B2 * | 4/2008 | Arnold et al. | 324/629 |
| 2003/0001668 | A1 | 1/2003 | Mruz et al. | |
| 2003/0030427 | A1 | 2/2003 | Logisch | |
| 2005/0218921 | A1 * | 10/2005 | Sanda et al. | 324/765 |
| 2006/0186896 | A1 | 8/2006 | Arnold et al. | |

FOREIGN PATENT DOCUMENTS

| | | | |
|---|---|---|---|
| DE | 102005005751 | A1 | 8/2006 |
| GB | 2282008 | A | 3/1995 |

(Continued)

OTHER PUBLICATIONS

"LVDS Splitter Simplifies High-Speed Signal Distribution", MAXIM Application Note 872, Dec. 13, 2001, http:// www.maxim-ic.com/appnotes.cfm/an_pk/872/>.

*Primary Examiner* — Melissa Koval
*Assistant Examiner* — Emily Chan

(57) ABSTRACT

A signal distribution structure for distributing a signal to a plurality of devices includes a first signal guiding structure including a first characteristic impedance. The signal distribution structure also includes a node, wherein the first signal guiding structure is coupled to the node. The signal distribution structure includes a second signal guiding structure including one or more transmission lines. The one or more transmission lines of the second signal guiding structure are coupled between the node and a plurality of device connections. The second signal guiding structure includes, side-viewed from the node, a second characteristic impedance which is lower than the first characteristic impedance. The signal guiding structure also includes a matching element connected to the node.

21 Claims, 29 Drawing Sheets

(56) References Cited

FOREIGN PATENT DOCUMENTS

| | | | |
|---|---|---|---|
| JP | 6288402 | A | 4/1987 |
| JP | 595210 | A | 4/1993 |
| JP | 5206711 | A | 8/1993 |
| JP | 10200313 | A | 7/1998 |
| WO | 0161780 | A1 | 8/2001 |

* cited by examiner $$S_{L \to R} = \frac{Z_L - Z_R}{Z_L + Z_R} = \frac{50\Omega - 7.1\Omega}{50\Omega + 7.1\Omega} = 0.75$$

$$S_{R \to L} = \frac{Z_R - Z_L}{Z_L + Z_R} = 0$$

$$S=\frac{Z_L - Z_R}{Z_L + Z_R}=\frac{50\Omega - 12.5\Omega}{50\Omega + 12.5\Omega}=0.6$$

```
***
V1 1 0 PWL(0ps 0V 1ps 1.6V)
R1 1 2 50
T1 2 0 3 0 Z0=50 TD=200p
R2 3 0 16.66
T2 3 0 4 0 Z0=12.5 TD=200p
T3 4 0 14 0 Z0=50 TD=200p
T4 4 0 15 0 Z0=50 TD=200p
T5 4 0 16 0 Z0=50 TD=200p
T6 4 0 17 0 Z0=50 TD=200p
C1 14 0 2.1p
C2 15 0 2p
C3 16 0 2p
C4 17 0 2p

.TRAN 1ps 5n
.END
```

Daisy Chain

Y-Sharing Topology

SIGNAL DISTRIBUTION STRUCTURE AND METHOD FOR DISTRIBUTING A SIGNAL

Embodiments according to the invention are related to a signal distribution structure and to a method for distributing a signal from a driver to a plurality of devices.

Some embodiments according to the invention are related to a concept for a 50Ω by by-4 Y-sharing and by-2 sharing, Some embodiments according to the invention can be used as a solution for massively parallel high-speed DRAM tests.

BACKGROUND OF THE INVENTION

In many applications, it is desirable to distribute a signal from a signal source to a plurality of signal sinks. For example, a distribution of a signal from a signal source to a plurality of signal sinks is useful, whenever a plurality of devices or components is to be supplied with identical input signals. However, signal integrity is often an issue in such applications.

SUMMARY

According to an embodiment, a signal distribution structure for distributing a signal to a plurality of device connections may have: a first signal guiding structure including a first characteristic impedance; a node, wherein the first signal guiding structure is coupled to the node; a second signal guiding structure including one or more transmission lines, wherein the one or more transmission lines of the second signal guiding structure are coupled between the node and the plurality of device connections, and wherein the second signal guiding structure includes, side-viewed from the node, a second characteristic impedance which is lower than the first characteristic impedance; and a matching element connected to the node; wherein the matching element is configured to match an impedance at the node, side-viewed from the second signal guiding structure, to the second impedance, while increasing a mismatch between an impedance at the node, side-viewed from the first signal guiding structure, and the first impedance.

According to another embodiment, a method for distributing a signal from a driver to a plurality of devices may have the steps of: providing a signal to a node via a first signal guiding structure including a first characteristic impedance; forwarding a portion of the signal incident to the node via the first signal guiding structure to the plurality of devices, wherein said portion of the signal is forwarded to the devices via a second signal guiding structure; reflecting another portion of the signal incident to the node via the first signal guiding structure back to the first signal guiding structure; and forwarding a signal portion of a signal incident to the node via the second signal guiding structure to the first signal guiding structure and to the matching element, while suppressing a reflection of said signal, incident to the node via the second signal guiding structure, back to the second signal guiding structure.

As an example only, out of a large variety of possible applications, requirements in solutions from the field of device testing will be described in the following.

In some applications, so-called "driver sharing" is used. Regarding the concept of "driver-sharing", it should be noted that a traditional test interface for automated test equipment (ATE) may, for example, use a point-to-point connection between tester resources (for example tester output channels and/or tester input channels), and a device-under-test (DUT). However, for cost sensitive applications, a plurality of devices, for example between two and thirty-two, or 64, or 128, or 256, or 512, . . . devices under test, may be tested in parallel. However, the testing of some devices such as, for example, DRAM testing, may entail a massive parallel testing to achieve the cost-of-test goals.

In some cases, in production a parallelism of a minimum of 64 devices under test may be useful. In other words, it may sometimes be desirable to test 64 devices, or even more devices, using a single tester. An economical way of achieving this may comprise sharing tester resources among devices-under-test. Since, for example, for dynamic random access memories (DRAMs), the number of inputs is-in some cases much higher than the number of outputs, a sharing of driver channels of the automated test equipment (ATE) may be particularly attractive.

However, in some cases, a reduced signal quality may be taken into account as a compromise, when drivers are shared. In particular, a reduction of the signal quality may occur at high speed.

In the following, the concept of shared drivers and non-shared drivers will be briefly explained taking reference to FIGS. 7*a* and 7*b*.

FIG. 7*a* shows a block schematic diagram of a device-under-test interface for a traditional parallel testing. In contrast, FIG. 7*b* shows a block schematic diagram of a driver-sharing device-under-test interface for massive parallel testing (or at least for parallel testing).

The test arrangement shown in FIG. 7*a* is designated in its entirety with 700. The test arrangement 700 comprises a plurality of automated test equipment driver channels 710*a* to 710*d*. Outputs of the automated test equipment driver channels 710*a* to 710*d* are connected to inputs of devices under test 712*a*, 712*b*. Moreover, the test arrangement 700 comprises a plurality of automated test equipment receiver channels 714*a* to 714*d*. Inputs of the automated test equipment receiver channels 714*a* to 714*d* may for example be connected to outputs of the devices under test 712*a*, 712*b*.

As can be seen from FIG. 7*a*, each of the automated test equipment driver channels 710*a* to 710*d* is only connected to a single device under test 712*a*, 712. Each of the automated test equipment receiver channels 714*a* to 714*d* is also connected to a single one of the devices under test 712*a,* 712*b*.

However, now taking reference to FIG. 7*b*, a test arrangement 750 will be described. The test arrangement 750 comprises a plurality of automated test equipment driver channels 760*a*, 760*b*, which may be identical to the automated test equipment driver channels 710*a* to 710*d*. However, a first one of the automated test equipment driver channels, for example an automated test equipment driver channel 760*a* may be connected to an input of a first device under test 762*a*, and also to an input of a second device under test 762*b*. Similarly, an additional automated test equipment driver channel 760*b* may be connected to inputs of a plurality of devices under test 762*a*, 762*b*, as shown in FIG. 7*a*. However, the test arrangement 750 may also comprise a plurality of automated test equipment receiver channels 764*a* to 764*d*. In some embodiments, the inputs of the automated test equipment receiver channels 764*a* to 764*d* may be connected only to a single device under test 762*a,* 762*b*.

To summarize the above, the concept of shared drivers versus non-shared drivers has been schematically described with reference to FIGS. 7*a* and 7*b*.

In the following, a plurality of conventional sharing concepts will be described taking reference to FIGS. 8*a* and 8*b*.

Conventionally, two topology schemes are often used for driver sharing. For example, a so-called "Y-sharing", which is also designated as "fork" or "fork sharing", may be used.

Alternatively, a so-called "Daisy-Chain", which may also be designated as "multidrop bus", "tapped bus", or "fly-by", may be used. Taking reference to FIG. 8*a*, the Y-sharing topology will briefly be discussed. The topology shown in FIG. 8*a* is designated in its entirety with 800. The topology 800 comprises a buffer or driver 810 which is coupled to a first transmission line 812. The first transmission line 812 may for example comprise an impedance of 50Ω. An end 814 of the first transmission line 812, which is opposite to the buffer or driver 810, may be connected with two further transmission lines 820, 822, as shown in FIG. 8. For example, a second transmission line 820 may comprise a characteristic impedance Z of Z=100Ω. Similarly, a third transmission line 822 may comprise a characteristic impedance of Z=100Ω. For example a first end 821 of the first transmission line 820 and a first end 823 of the third transmission line 822 may be coupled to a node 830, to which the second end 814 of the first transmission line 812 is also coupled.

Moreover, a first device under test 840 (or an input thereof, or an input/output thereof) may be coupled to the second transmission line 820, as shown in FIG. 8*a*. Similarly, a second device under test 842 (or an input thereof, or an input/output thereof) may be coupled to the third transmission line 822.

It should be noted here that a matching condition is obtained at the node 830 for signals or waves traveling in both directions. Signals incident to the node 830 from the first transmission line 812 will "see" an impedance of 50Ω, as the "joint" characteristic impedance of the second transmission line 820 and third transmission line 822, side-viewed from the node 830, is 50Ω. Signals (or waves) which are reflected by the devices under test 840, 842, and which come back from the devices under test, do not find a matched impedance, but find an Impedance of 50Ω in parallel with 100Ω (50Ω||100Ω). The two reflections cancel out each other. This can be noticed if, for example, a 50Ω termination is applied at the position of the second device under test 842 in order to prevent a reflection at this position. In this case, the reflections do no longer cancel out at the node 830, and massive distortions appear. The main operating principle is an opposite erasement or cancellation of reflections.

Thus, there will be no reflection (or only a negligible reflection) at the node 830, if signals are reflected by the devices under test 840, 842. Thus, signals reflected at the devices under test 840, 842 will travel back to the buffer or driver 810 via the first transmission line 812, and may be absorbed in the driver 810. However, the price for this matching condition is the need to fabricate transmission lines having a comparatively high impedance of 100Ω, which is challenging in some transmission line fabrication technologies.

In the following, the so-called "Daisy-Chain" topology will be described taking reference to FIG. 8*b*. FIG. 8*b* shows a test arrangement, which is designated in its entirety with 850. The test arrangement 850 comprises a buffer or driver 860, a first transmission line portion 870, a second transmission line portion 872, and a third transmission line portion 874. The first transmission line portion 870 may comprise a characteristic impedance of Z=50Ω, and may be circuited between an output of the driver or buffer 860 and a first node 880. A first device under test 882 may be coupled to the first node 880 via a branch connection or tap connection 884. Moreover, the second transmission line portion 872 may comprise a characteristic impedance of Z=50Ω, and may be circuited between the first node 880 and a second node 890. A second device under test 892 may be coupled to the second node via a second branch connection or tap connection 894. Moreover, the second node 890 may be connected to a termination circuit 896 via the third transmission line portion 874. The termination circuit 896 may, for example, comprise a termination voltage source 896*a* having a characteristic impedance 896*b*. The characteristic impedance or inner impedance (or inner resistance) may be matched to the impedance of the transmission line portions 870, 872, 874.

In the following, some problems arising from the above-mentioned topologies (Y-sharing topology and Daisy-Chain topology) will be discussed. It will be assumed that said conventional topologies would be used for a BY-4 sharing. It should be noted that in the following, only a single driver is shown, while the concept can naturally be extended to test arrangements comprising more than one driver.

FIG. 9 shows a block schematic diagram of a Y-sharing topology applied for implementing a BY-4 sharing. The circuit arrangement shown in FIG. 9 is designated in its entirety with 900. As can be seen, an output of a driver 910 is coupled to a first transmission line 920, comprising a characteristic impedance of, for example, 50Ω. The first transmission line 920 is coupled to a branch point or branch node 930. Two transmission lines 940, 942 are also coupled to the branch point 930. A second transmission line 940 and a third transmission line 942 may, for example, both comprise a characteristic impedance of Z=100Ω. The end of the second transmission line 940 may for example be coupled to a second branch point or branch node 950. Two further transmission lines, namely a fourth transmission line 960 and a fifth transmission line 962 may be coupled to the second branch node 950. The fourth transmission line 960 and the fifth transmission line 962 may, for example, comprise a characteristic impedance of Z=200Ω to achieve matching at the second branch node 950. However, it should be noted that a transmission line comprising an impedance as high as Z=200Ω is very difficult to fabricate, at least using conventional transmission line fabrication technology. Thus, in some fabrication technologies, the need to fabricate a transmission line having an impedance of Z=200Ω may be even considered as a "killer" (or at least a very big challenge) for printed circuit board manufacturing (PCB-manufacturing).

To summarize the above, using a Y-sharing topology for implementing a BY-4 sharing brings along the difficulty that transmission lines comprising comparatively high characteristic impedance need to be fabricated. However, the fabrication of transmission lines comprising comparatively high characteristic impedance is sometimes difficult and/or costly.

In the following, details regarding the Daisy-Chain topology will be described. FIG. 10 shows a block schematic diagram of a Daisy-Chain topology comprising four devices under test. The block schematic diagram of FIG. 10 is designated in its entirety with 1000. The circuit arrangement 1000 comprises a driver or a buffer 1010. The circuit arrangement 1000 also comprises a tapped transmission line 1020 having a characteristic impedance of, for example, Z=50Ω. The circuit arrangement 1000 also comprises four devices under test 1030*a* to 1030*d*, inputs of which are coupled to taps of the tapped transmission line 1020. The tapped transmission line 1020 is terminated by a termination circuit 1040.

In the following, disadvantages of the Daisy-Chain concept will subsequently be described taking reference to FIG. 11. FIG. 11 shows an equivalent circuit of the Daisy-Chain topology shown in FIG. 10. The equivalent circuit is designated in its entirety with 1100. The equivalent circuit 1100 comprises the driver/buffer 1010. Portions of the tapped transmission line 1020 between the taps can be represented as transmission line portions 1020*a*, 1020*b*, 1020*c*, 1020*d*, and 1020*e*. Inputs of the devices under test 1030*a* to 1030*d* can be represented by capacitances 1130*a* to 1130*d*, which can be considered as parasitic input capacitances. In addition, the tap lines or branch lines can be considered as stubs.

As indicated at reference numeral 1150, each tap of the tapped transmission line 1020 may cause a reflection. The reflection may for example originate from the stub branching from the tapped transmission line 1020, and also from the parasitic input capacitances 1130*a* to 1130*d* of the devices 1030*a* to 1030*d*.

The reflections caused by the taps of the tapped transmission line 1120, and by the input of the devices under 1030*a* to 1030*d* may result in a degradation of the signals, as shown at reference numeral 1170.

A signal representation at reference numeral 1170 describes the signal seen at the input of the first device under test 1030*a*. An abscissa 1172 describes a time, and an ordinate 1174 describes a signal at the input of the first device under test 1030*a*. As can be seen from the graphical representation at reference numeral 1170, the signal at the input of the first device under test 1030*a*, which is represented by a line 1176, is distorted by reflections 1178*a*, 1178*b*, and 1173*c* from the second device under test, from the third device under test and from the fourth device under test. The distortion caused by the reflections is the stronger the steeper the signal transition of the signal generated by 1010 are. To summarize the above, FIG. 11 shows the speed-limiting reflections for the Daisy-Chain topology, and also explains the source of the speed-limiting reflections.

In the following, some pro's (or advantages) and con's (disadvantages) for the two topologies mentioned above will briefly be discussed.

Y-Sharing:
- Pro's
  - Perfect signal integrity when exact symmetry is achieved;
  - No additional resources for termination may be used.
- Con's
  - Difficult to manufacture 100Ω trace impedance on DUT-PCB for by-2 sharing;
  - By-4 sharing (two forks) may use 200Ω, which is impossible (or at least difficult and/or costly) to manufacture;
  - Parasitic input capacitance is charged from high impedance line (for example 100Ω), which may result in a comparatively slow rise time.

Daisy-Chain:
- Pro's
  - Higher sharing degree (for example by-4 sharing) can be manufactured with standard printed circuit board (PCB) process and stackup (as for example all traces may comprise an impedance of 50Ω:
  - Works well at high speed. Parasitic input capacitance (of the devices under test) may be loaded from 50Ω. This may result in good rise times.
- Con's
  - Reflections from stubs and parasitic input capacitances may limit the maximum possible speed;
  - Needs additional termination device power supply (DPS);
  - Lower swing due to termination.

In view of the above, there is a need for a concept of forwarding a signal to a plurality of devices, which brings along a good compromise with respect to signal integrity and production costs.

Some embodiments according to the invention create a signal distribution structure for distributing a signal to a plurality of devices. The signal distribution structure may comprise a first signal guiding structure, comprising a first characteristic impedance. The signal distribution structure may further comprise a node, wherein the first signal guiding structure is coupled to the node. The signal distribution structure may also comprise a second signal guiding structure comprising one or more transmission lines. The one or more transmission lines of the second signal guiding structure may be coupled between the node and a plurality of device connections. The second signal guiding structure may comprise, side-viewed from the node, a second characteristic impedance which is lower than the first characteristic impedance. The signal distribution structure may comprise a matching element connected to the node. The matching element may be configured to match an impedance at the node, side-viewed from the second signal guiding structure, to the second impedance, while increasing the mismatch between an impedance at the node, side-viewed from the first signal guiding structure, and the first impedance.

For example, assuming that the impedance of the first signal guiding structure is higher than the impedance of the second signal guiding structure, a matching between the first signal guiding structure and the second signal guiding structure in the absence of the matching element can be characterized by a reflection coefficient. In the absence of the matching element, a magnitude of the reflection coefficient may be determined by the characteristic impedances of the first signal guiding structure and the second signal guiding structure.

However, in the presence of the matching element, a first reflection coefficient, describing a reflection of a wave incident via the first signal guiding structure, may be determined by the characteristic impedance of the first signal guiding structure and an impedance of a parallel circuit of the second signal guiding structure and the matching element. The impedance of said parallel circuit may be lower than the characteristic impedance of the second signal guiding structure. Accordingly, a mismatch for waves incident via the first signal guiding structure is increased.

Also, in the presence of the matching element; a second reflection coefficient, describing a reflection of a wave incident via the second signal guiding structure, may be determined by the characteristic impedance of the second signal guiding structure and by an impedance of a parallel circuit of the first signal guiding structure and the matching element. The impedance of said parallel circuit may approximate the characteristic impedance of the second signal guiding structure. Accordingly, a mismatch for waves incident via the second signal guiding structure may be reduced in the presence of the matching element, when compared to a case in the absence of the matching element. Some embodiments according to the invention are based on the finding that a signal transmission or a signal distribution from the first signal guiding structure to the devices connected to the second signal guiding Structure can be performed with good signal integrity and at reasonable cost, if an impedance mismatch of signals traveling towards the node via the first signal guiding structure is tolerated. However, it has also at the same time been found that the signal integrity can be significantly improved, if an impedance match is achieved, for signals reflected from the devices, which reflected signals are traveling towards the node via the second signal guiding structure. Thus, while costs can be reduced by allowing a mismatch in a forward signal transmission direction (i.e. from the first signal guiding structure towards the second signal guiding structure), signal integrity can be ensured by providing matching in a backward signal transmission direction (i.e. from the second signal guiding structure towards the first signal guiding structure).

Also, if the second signal guiding structure comprises multiple conductors coupled to the node, reflections traveling towards the node via the multiple conductors may cancel out, at least partially, due to the presence of the matching element. For example, if the second signal guiding structure comprises two conductors, waves traveling towards the node concurrently via the two conductors may be reflected at the node, but the reflections may cancel out at least partially.

It has been found that coupling a matching element to the node may be used to provide the matching in the backward signal transmission direction, if the characteristic impedance of the second signal guiding structure is lower than an impedance of the first signal guiding structure. However, it has also been found that an increase of a mismatch in the forward signal transmission direction, which is caused by the matching element, is tolerable in many environments and does not severely degrade the signal integrity. In other words, it has surprisingly been found that the advantage resulting from an improvement of the matching in the backward signal transmission direction, which improvement is caused by the presence of the matching element, strongly outweighs the disadvantages caused by a deterioration of the matching in the forward signal transmission direction, which deterioration is also caused by the matching elements.

BRIEF DESCRIPTION OF THE DRAWINGS

Embodiments of the present invention will be detailed subsequently referring to the appended drawings, in which.

DETAILED DESCRIPTION OF THE INVENTION

In the following, different embodiments according to the invention will be explained taking reference to FIGS. 1 to 6.

Figure 1:
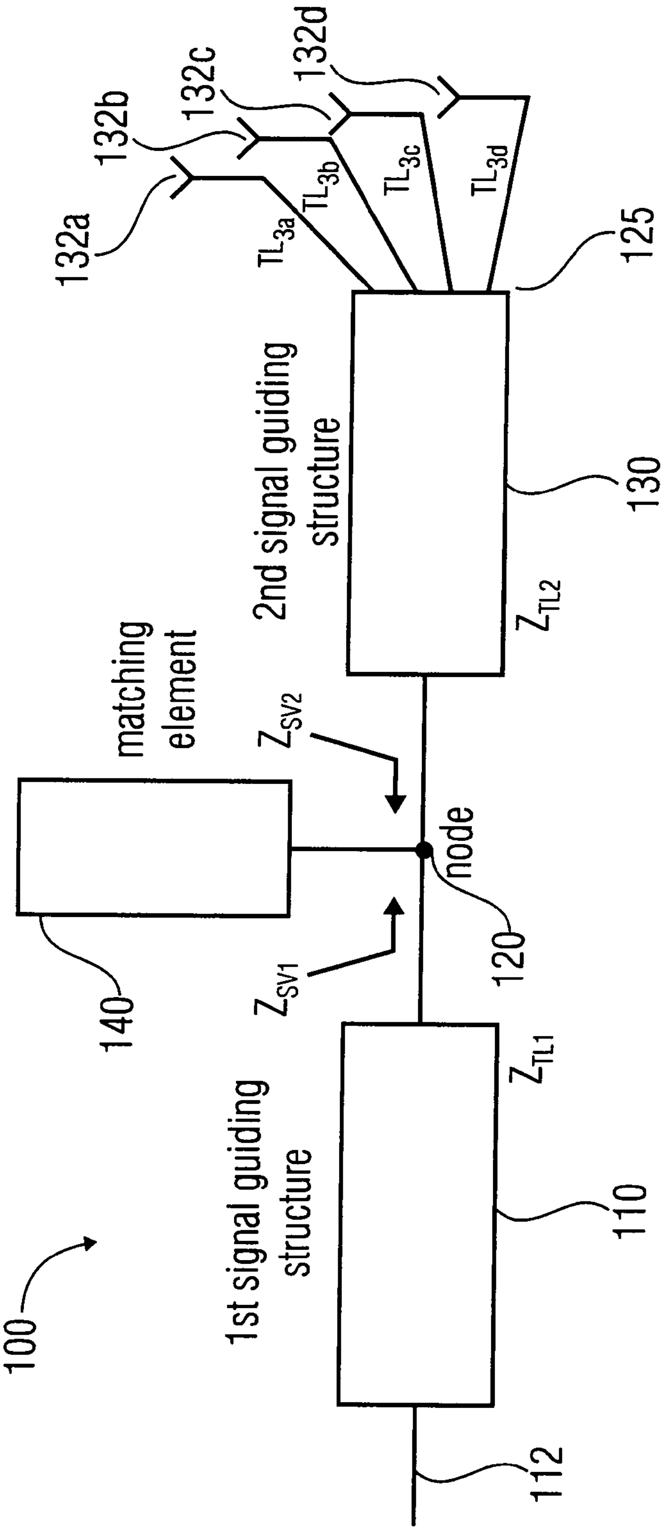
FIG. 1 shows a block schematic diagram of a signal distribution structure, according to an embodiment of the invention.

FIG. 1 shows a block schematic diagram of a signal distribution structure according to an embodiment according to the invention. The signal distribution structure shown in FIG. 1 is designated in its entirety with 100. The signal distribution structure 100 comprises a first signal guiding structure 110. The first signal guiding structure 110 comprises a first characteristic impedance $Z_{TL1}$. The signal distribution structure 100 also comprises a node 120. The first signal guiding structure 110 is coupled to the node 120. Moreover, the signal distribution structure 100 comprises a second signal guiding structure 130. The second signal guiding structure 130 comprises one or more transmission lines. The second signal guiding structure 130 is also coupled to the node 120 and comprises, side-viewed from the node, a second characteristic impedance $Z_{TL2}$. The second characteristic impedance $Z_{TL2}$ is lower than the first characteristic impedance $Z_{TL1}$.

Moreover, the signal distribution structure 100 comprises a matching element 140 connected to the node. The matching element 140 is configured to match an impedance $Z_{SV2}$ at the node, side-viewed from the second signal guiding structure 130, to the second impedance (impedance or overall impedance $Z_{TL2}$ of the second signal guiding structure). The matching element 140 also increases a mismatch, for example as explained above, between an impedance $Z_{SV1}$ at the node, side-viewed by the first signal guiding structure 110, and the first impedance $Z_{TL1}$ (the impedance of the first signal guiding structure 110.

Moreover, it should be noted that the second signal guiding structure is typically coupled to a plurality of device connections 132*a* to 132*d*.

In the following, the functionality of the signal distribution structure 100 will be described. It is assumed here that it is desired to distribute a signal from a first end 112 of the first signal guiding structure 110 towards the device connections 132*a* to 132*d* via the first signal guiding structure 110, the node 120, and optionally the second signal guiding structure 130. A signal which is fed to the first end of the first signal guiding structure may propagate via the first signal guiding structure 110 towards the node. As the impedance $Z_{SV1}$ at the node, side-viewed from the first signal guiding structure 110, is mismatched with respect to the impedance $Z_{TL1}$ of the first signal guiding structure, a portion of the signal energy is reflected back into the first signal guiding structure 110. Another portion of the signal energy is dissipated in the matching element 140. However, yet another portion of the signal energy propagates towards the device connections 132*a* to 132*d* via the second signal guiding structure 130 which in some embodiments may have zero length (vanishes).

To summarize the above, if a signal is fed to the first end 112 of the first signal guiding structure 110, a portion of said signal is forwarded to the device connections 132*a* to 132*d*, and another portion of the signal is reflected back to the first end 112 of the first signal guiding structure 110. However, assuming that the first end 112 of the first signal guiding structure is terminated with an impedance approximating the characteristic impedance $Z_{TL1}$ of the first signal guiding structure (or being the complex-conjugate thereof in an ideal case), multiple reflections can be avoided. Thus, as an effect, multiple reflections when forwarding a signal from the first end 112 of the first signal guiding structure 110 towards the device connections 132*a* to 132*d* can be avoided.

In the following, it is assumed that a portion of a signal provided to the device connections 132*a* to 132*d* is reflected, for example, because the inputs of the devices connected to the device connections 132*a* to 132*d* are mismatched with respect to the second signal guiding structure 130.

For example, the connections between the second signal guiding structure 130 and the device connections 132*a* to 132*d* may comprise transmission lines T13*a* to T13*d*, each having a characteristic impedance Zt13. The reflection at a device connected to one of the device connections 132*a* to 132*d* is determined by the fact that the device impedance (or device input impedance) does not match the characteristic impedance Zt13. In many cases, the device impedance is a high impedance, or is a capacitive impedance. Thus the signal is reflected back into the transmission lines T13*a* to T13*d* at the device connections 132*a* to 132*d*. As these reflections occur with the same phase at all four devices (assuming the devices are sufficiently similar), the reflections add up at the node 125, where all four transmission lines T13*a* to T13*d* converge. Accordingly, there is only a signal traveling back to towards the node 120, but there are no signals (or only negligible signals) traveling back towards the device connections 132*a* to 132*d*. Zt13 may be chosen such that it fits Zt12. For example, in a by-4-sharing, the relationship Zt13=4*Zt12 may be fulfilled.

A Signal reflected back from the node 125 may propagate towards the node 120 via the second signal guiding structure 130. However, as was previously discussed, the impedance at the node 120, side-viewed from the second signal guiding structure 130 (which impedance is designated with $Z_{SV2}$) is matched to the characteristic impedance $Z^{TL2}$ of the second signal guiding structure. Thus, signals reflected by the devices and propagating towards the node 120 via the second signal guiding structure 130 will not be reflected back towards the devices when arriving at the node 120, due to the impedance at the node, side-viewed from the second signal guiding structure, being matched to the impedance of the second signal guiding structure. Accordingly, the signals reflected back from the devices will not result in a multiple reflection, which could lead to severe signal degradation. Rather, a portion of the signals reflected by the devices will be dissipated in the matching element 140. Another portion of the signals reflected by the devices will propagate from the node 120 towards the first end 112 of the first signal guiding structure 110. Accordingly, if the first end 112 of the first signal guiding structure is possibly terminated, multiple reflections can be avoided.

To summarize the above, signal integrity may be maintained by providing a matching at the node 120 and node 125 for signals reflected back from the device connections 132*a* to 132*d*. However, allowing for a mismatch for signals propagating from the first end 112 of the first signal guiding structure 110 towards the device connections 132*a* to 132*d*, allows the use of the second signal guiding structure 130, an impedance of which is lower than an impedance of the first signal guiding structure 110 and a third impedance of T13*a-d* which is 50 ohm. Both can be fabricated easily in a standard PCB process. Accordingly, the cost efficiency can be improved by avoiding a need for fabricating high impedance signal guiding structures.

In the following, some possible implementations will be described taking reference to FIGS. 2*a*, 2*b*, 3*a*, and 3*b*.

Figure 2A:
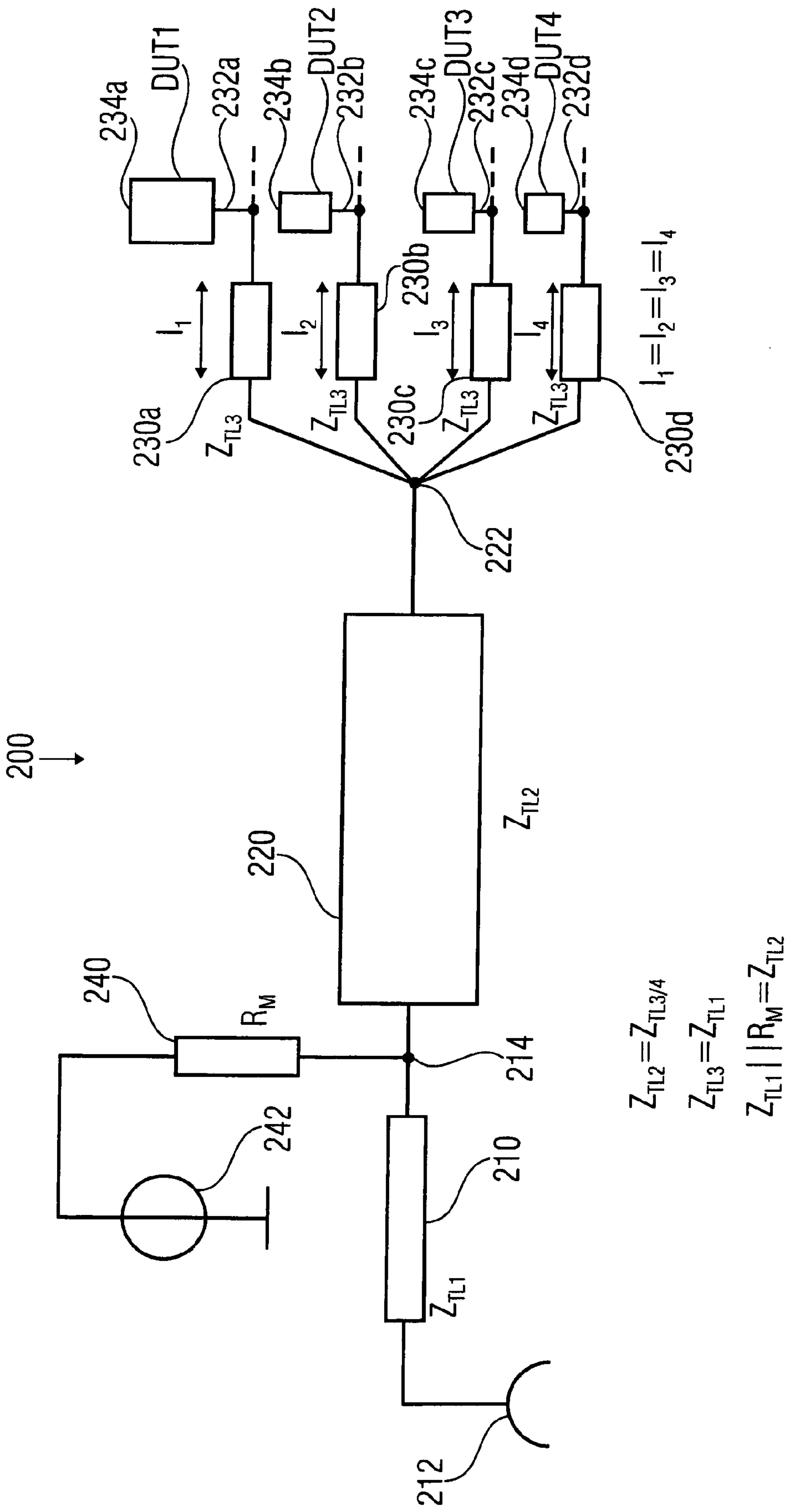
FIGS. 2*a* and 2*b* show block schematic diagrams of signal distribution structures according to an embodiment of the invention.

FIG. 2*a* shows a block schematic diagram of a signal distribution structure, according to an embodiment according to the invention. The signal distribution structure shown in FIG. 2*a* is designated in its entirety with 200. The signal distribution structure 200 comprises a first transmission line 210, which is coupled between a connection 212 and a node 214. A second transmission line 220 is coupled between the node 214 and a branching node or branch point 222 (which may be equivalent to the node 125). The second transmission line 220 may optionally comprise a length of 0, i.e. may cease to exist. A plurality of transmission lines 230*a* to 230*d* is connected to the branching node 222. Moreover, branch-transmission-lines 230*a* to 230*d* may be connected between the branching node 222 and corresponding connections 232*a* to 232*d* for coupling (optional) devices 234*a* to 234*d* to the transmission lines 230*a* to 320*d*. In an alternative embodiment, a by-2-structure may be used, wherein only two transmission lines 230*a* and 230*b* out of the transmission lines 230*a* to 230*d* shown in FIG. 2*a* may be present.

Moreover, a matching element, for example a resistor 240 having a resistance $R_M$ may be coupled to the node 214. While a first terminal of the resistor 240 may be connected to the node 214, a second terminal of the resistor 240 may be coupled to a voltage source 242.

If N branch transmission lines are connected at the node 222, the equations $$Zt12=Zt13/N$$

and $$Rm=(Zt12*Zt11)/(Zt11-Zt12)$$

may hold (at least approximately).

In an advantageous embodiment, Zt13 and Zt11 may lie between 50 Ohm and 70 Ohm, because printed circuit board manufacturers can fabricate such transmission lines well, and because Zt12 becomes smaller in this case, which can also be fabricated well.

Regarding the functionality of the signal distribution structure 200, it should be noted that a signal can be forwarded from the connection 212 to the device connections 232*a* to 232*d*, or to the devices 234*a* to 234*d*.

In an embodiment, the following relationships may hold for the characteristic impedance $Z_{TL1}$ of the first transmission line 210, for the characteristic impedance $Z_{TL2}$ of the second transmission line 220, for the characteristic impedance $Z_{TL3}$ of the branch transmission lines 232*a* to 232*d*, and for the impedance $R_M$ of the resistor 240;

$$Z_{TL2}=Z_{TL3}/N;$$

$$Z_{TL3}=Z_{TL1}; \text{ and}$$

$$Z_{TL1}//R_M=Z_{TL2}.$$

However, generally, Zt13 can be chosen freely in a range 0<Zt13<Zt11*N. Also, the equation $$Rm=(Zt12*Zt11)/(Zt11-Zt12)$$

may be fulfilled.

In some embodiments, impedances of 70 Ohm or 100 Ohm may be used for ZT13.

In the above equations, N designates the number of branch transmission lines 230*a* to 230*d* branching from the branching node 222. Naturally, some tolerances may occur. It has been found that a deviation from the above defined values by 30% (or even more) is well acceptable. However, if the deviations from the above defined values is less than 10%, a particularly good suppression of reflections can be achieved. The length of Zt12 (or of the transmission line 220) may be set to 0 with the effect that it can be omitted.

Taking into consideration the above described impedance values, the impedance situation as described with reference to FIG. 1 can be obtained at the node 214. Moreover, there is an impedance match condition for signals propagating towards the branching node 222 via the second transmission line 220, such that the signal reflections can be avoided.

In an embodiment in which the lengths $l_1$, $l_2$, $l_3$, $l_4$ of the branch transmission lines 230*a* to 230*d* are, at least approximately identical, a matching condition is also fulfilled at the branching node 222 for signals reflected back from the device connections 232*a* to 230*d*. For example, it may be sufficient if the length of the branch transmission lines 232*a* to 232*d* do not differ by more than 10%. An even better matching can be achieved if the lengths do not differ by more than 5%.

In some embodiments, the connection 212, the transmission lines 210, 220, 230*a* to 230*d* and the device connections 232*a* to 232*d* may be arranged on a device-under-test board for usage in a device tester. The resistor 240 may also be placed on or in the device-under-test board. Thus, the signal distribution structure 200 may be used for distributing signals to a plurality of devices-under-test, when performing a device test.

Figure 2B:
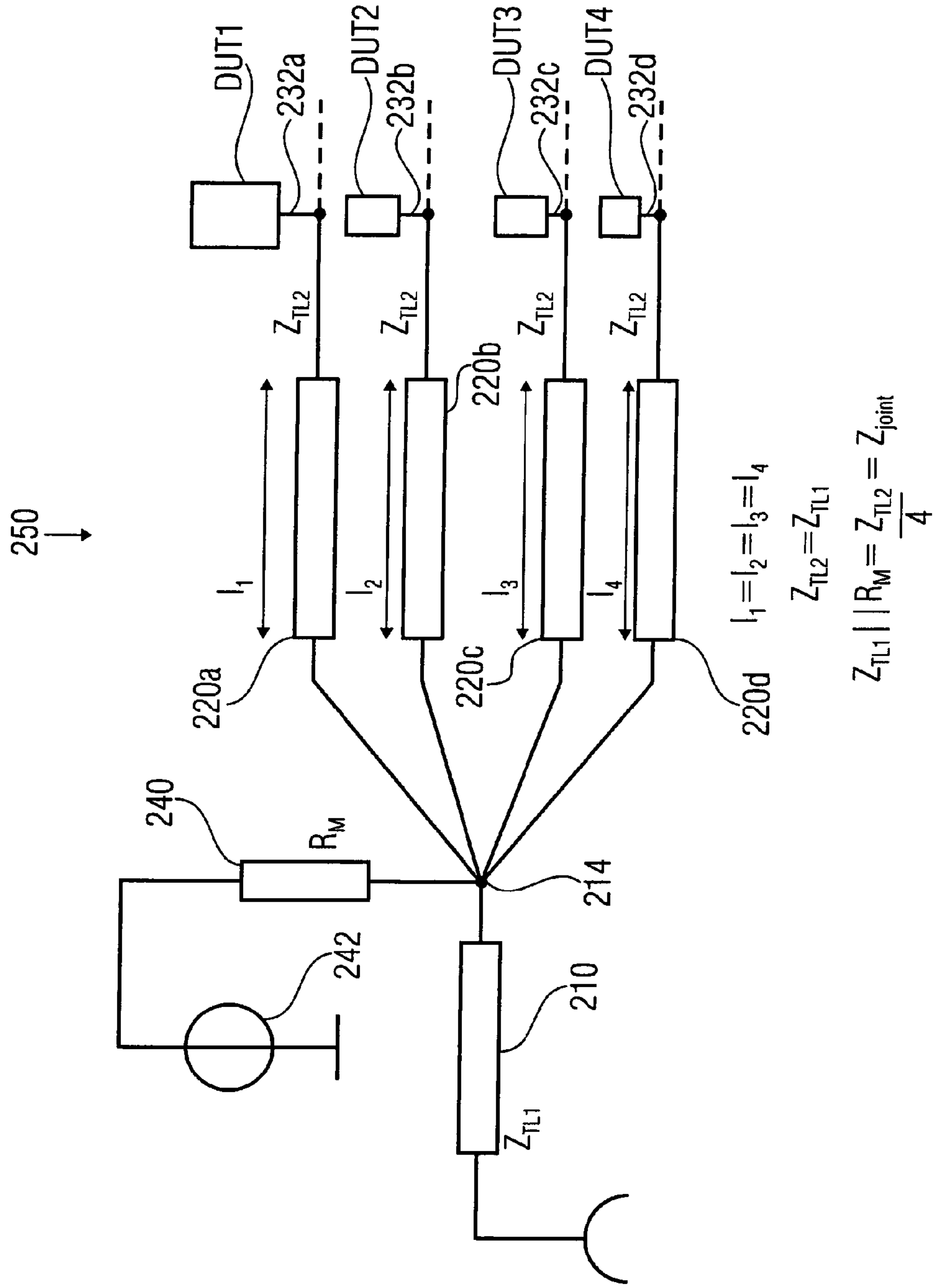

Taking reference now to FIG. 2*b*, a slightly different embodiment is shown. As the embodiment shown in FIG. 2*b* is very similar to the embodiment shown in FIG. 2*a*, identical reference numerals designate identical means and signals.

The signal distribution structure 250 shown in FIG. 2*b* differs from the signal distribution structure 200 of FIG. 2*a* in that a plurality of branch transmission lines 220*a* to 220*d* are directly coupled to the node 214. In other words, the second transmission line 220 of the signal distribution structure 200 is omitted, such that the branching node 222 coincides with the node 240. In other words, the transmission lines 220*a* to 220*d* take over the functionality and characteristics of the transmission lines 230*a* to 230*d*.

However, apart from the fact that the transmission line 220 of the signal distribution structure 200 is omitted, the electrical functionality of the signal distribution structure 250 is very similar to the functionality of the signal distribution structure 200. It should be noted here that the transmission lines 220*a* to 220*d* present a joint impedance to the node 214, which is determined by the parallel connection of the transmission lines 220*a* to 220*d*. Assuming that there are N transmission lines 220*a* to 220*d* having approximately identical impedances $Z_{TL2}$, a joint impedance $Z_{joint}$ of the transmission lines 220*a* to 220*d* is identical to $Z_{TL2}$/N. It should be noted here that the transmission lines 220*a* to 220*d* can be considered as a second signal guiding structure, and that the joint impedance $Z_{joint}$ can be considered as the impedance of the second signal guiding structure, side-viewed from the node 214.

Again, the first transmission line 210, the transmission lines 220*a* to 220*d*, the DUT connections 230*a* to 230*d*, and the resistor 240 may be arranged on (or in) a device-under-test board, for example for usage in combination with a device tester.

It should be noted that the branch point 214 may be implemented as a via. In some embodiments, the via forming the branch point 214 may be designed for good symmetry. Otherwise, some signal distortions may occur.

Figure 3A:
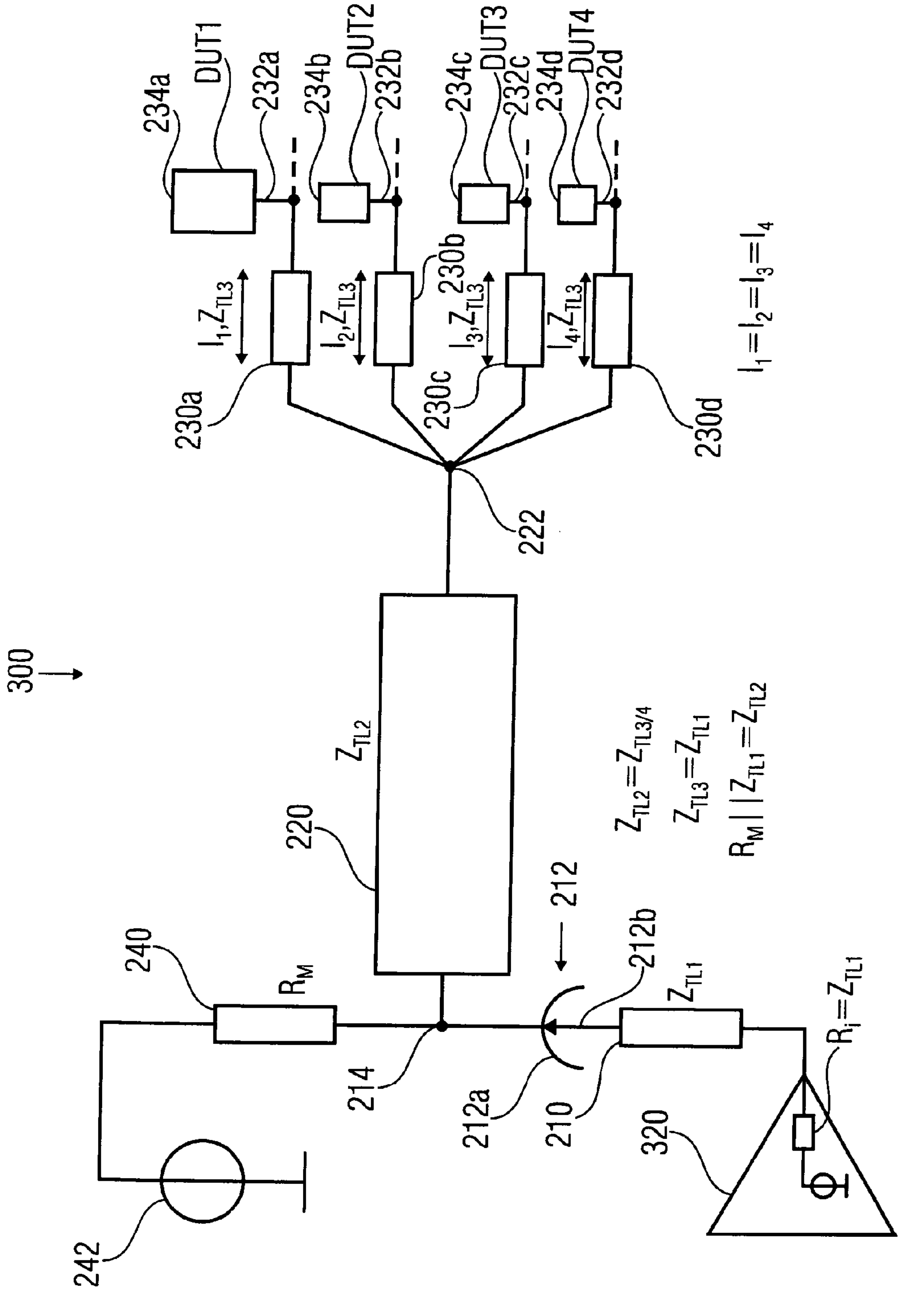
FIGS. 3*a* and 3*b* show block schematic diagrams of signal distribution structures according to embodiments of the present invention.
Figure 3B:
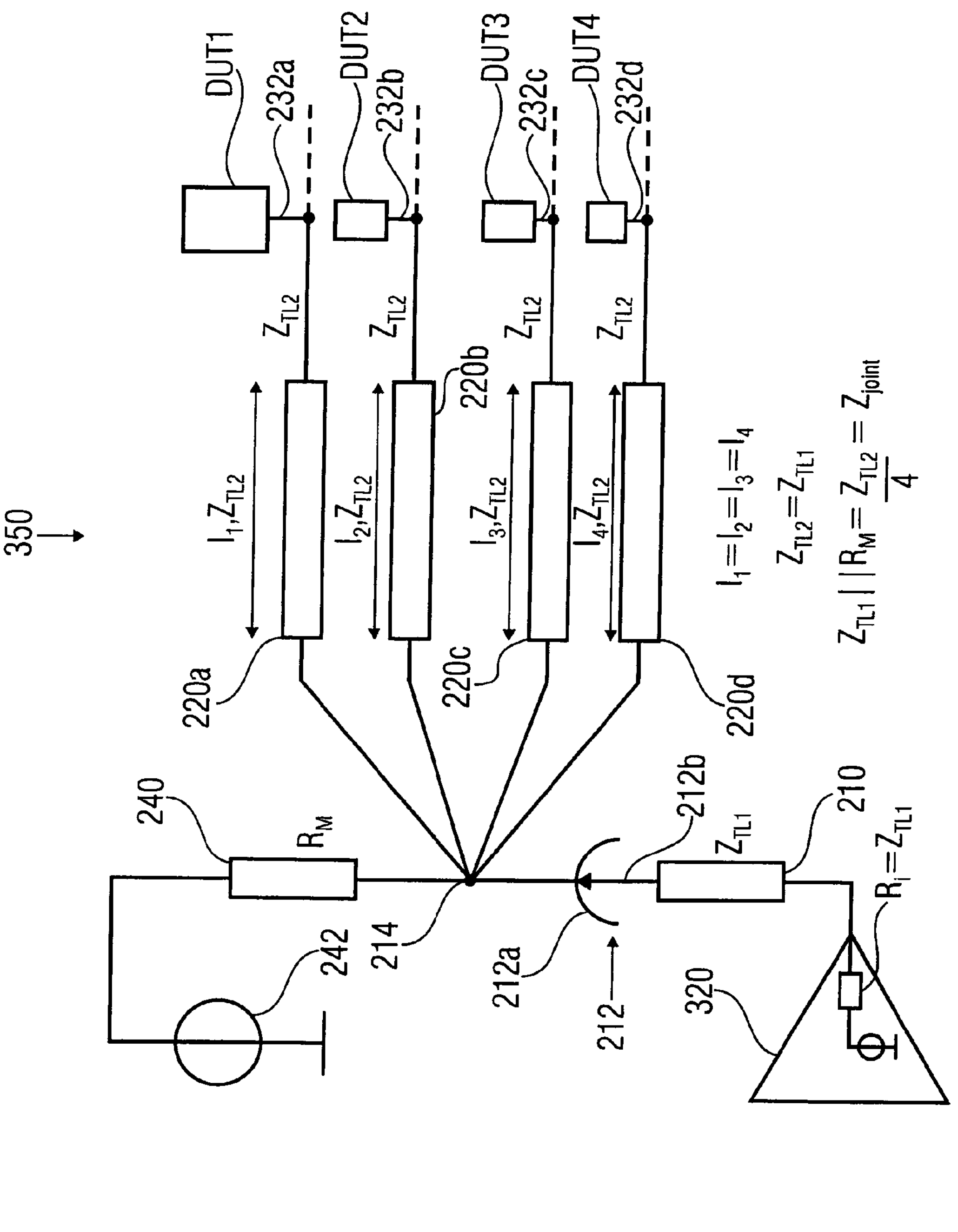

In the following, some modifications of the signal distribution structures 200, 250 will be described taking reference to FIGS. 3*a* and 3*b*. FIG. 3*a* shows a block schematic diagram of a signal distribution structure, according to an embodiment of the invention. The signal distribution structure shown in FIG. 3*a* is designated in its entirety with 300. The signal distribution structure 300 shown in FIG. 3*a* is very similar to the distribution structure 200 shown in FIG. 2*a*, such that identical means and signals are designated with identical reference numerals. However, the signal distribution structure shown in FIG. 3*a* differs from the signal distribution structure 200 shown in FIG. 2*a* in that the first transmission line 210 is not directly coupled to the node 214. Rather, a connection 212 is arranged electrically between the first transmission line 210 and the node 214. The connection 212 may for example comprise a connection via 212*a* and a connection pin 212*b*. The connection via 212*a* and the connection pin 212*b* may for example form a detachable electrical connection between the first transmission line 210 and the node 214.

However, it should be noted that the connection 212 may be considered as a part of a first signal guiding structure. Nevertheless, an impedance of the first signal guiding structure, comprising the connection 212 and the first transmission line 210, is typically dominated by a characteristic impedance of the first transmission line 210, as the connection 212 is typically designed such that it forms a negligible impedance discontinuity.

Moreover, the signal distribution structure 300 may comprise a driver or buffer 320. An output of the driver or buffer 320 may be coupled to the first transmission line 210. Thus, the signal provided by the driver or buffer 320 can be forwarded to the devices 234*a* to 234*d* via the first transmission line 210, the node 214, the second transmission line 220, and the branch transmission lines 230*a* to 230*d*. In some embodiments, a signal degradation can be reduced by providing the driver 320 with an output impedance which is impedance matched with the characteristic impedance of the first transmission line 210. Thus, even if signals reflected back by the inputs of the devices 234*a* to 234*d* propagate to the output of the driver 320, the reflected signals are absorbed in the output impedance of the driver 320.

In some embodiments, the connection via 212*a*, the second transmission line 220, the branch transmission lines 230*a* to 230*d* and the device connections 232*a* to 232*d* may be arranged on (or in) a device-under-test board for usage in a device tester. Moreover, the resistor 240 may be arranged on (or in) the device-under-test board. In contrast, the driver 320, the first transmission line 210, and the connection pin 212*b* may for example be part of a device tester.

Taking reference now to FIG. 3*b*, another modification of the signal distribution structure will be described. FIG. 3*b* shows a block schematic diagram of a signal distribution structure 350, according to an embodiment of the invention. The signal distribution structure 350 is very similar to the signal distribution structure 250 shown in FIG. 2*b*. Accordingly, identical means and signals are designated with identical reference numerals. However, the first transmission line 210 is not connected to the node 214 directly in the signal transmission structure 350 of FIG. 3*b*. Rather, a connection 212 is arranged between the first transmission line 210 and the node 214. The connection 212, may for example, comprise a connection via 212*a* and a connection pin 212*b*. A driver 320 may also be connected to the first transmission line 210, as shown in FIG. 3*b*. The driver 320 of the signal distribution structure 350 may be identical to the driver 320 of the signal distribution structure 300.

The connection via 300*a*, the branch transmission lines 320*a* to 320*d* and the device connections 323*a* to 323*d* may also be arranged on (or in) a device-under-test board, as explained above. In addition, the resistor 240 may be arranged on (or in) the device-under-test board. In contrast, the driver 320, the first transmission line 210, the connection pin 212*b*, and the voltage source or power supply 242 may be part of a device tester.

To summarize the above, a plurality of different possible arrangements has been described with reference to FIGS. 2*a*, 2*b*, 3*a*, and 3*b*. All the signal distribution structures 200, 250, 300, and 350 realize the concepts described with regard to FIG. 1. Characteristic impedances of the different components are given, for an ideal case, by the corresponding equations in FIGS. 2*a*, 2*b*, 3*a*, and 3*b*. However, some tolerances may apply, and tolerance deviations from the ideal values of up to 30% may be acceptable in many applications.

Figure 4A:
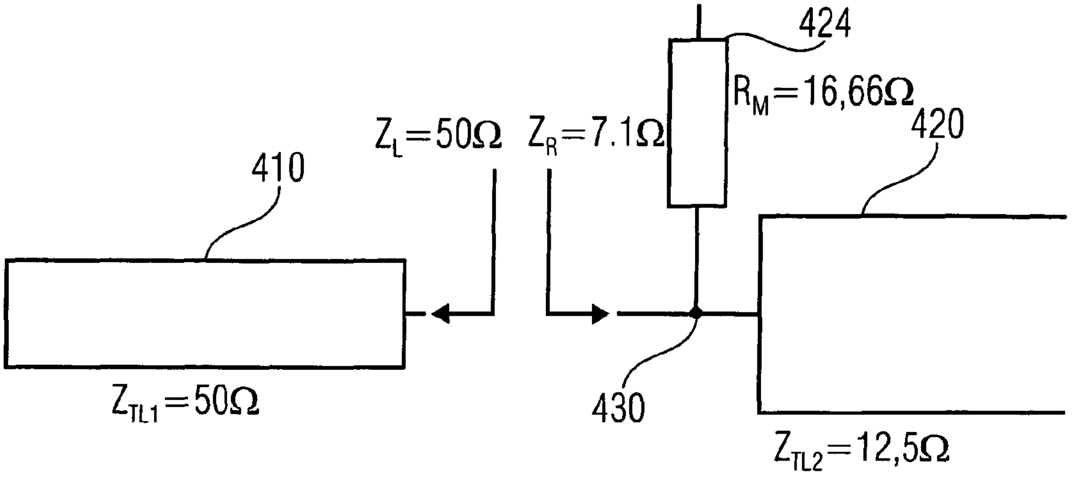
FIGS. 4*a*, 4*b*, and 4*c* show a graphical representation of matching conditions.
Figure 4B:
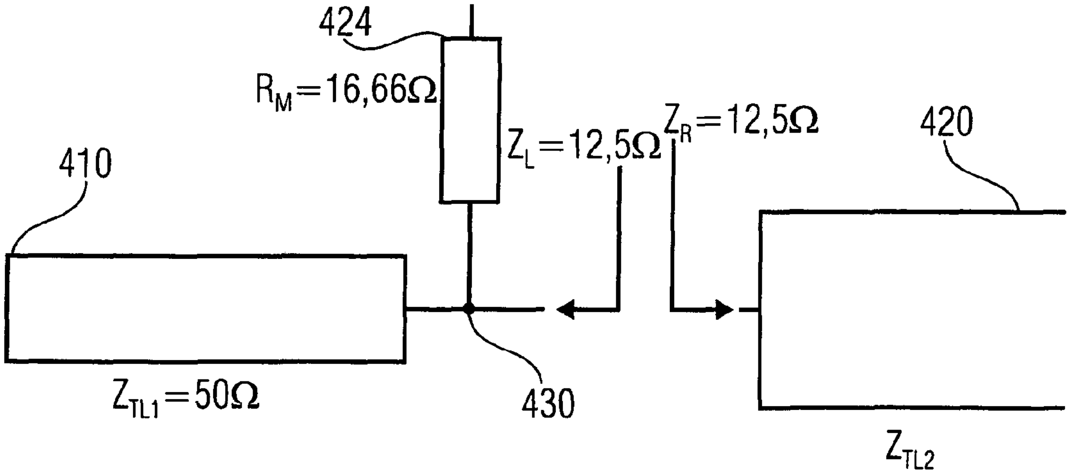
Figure 4C:
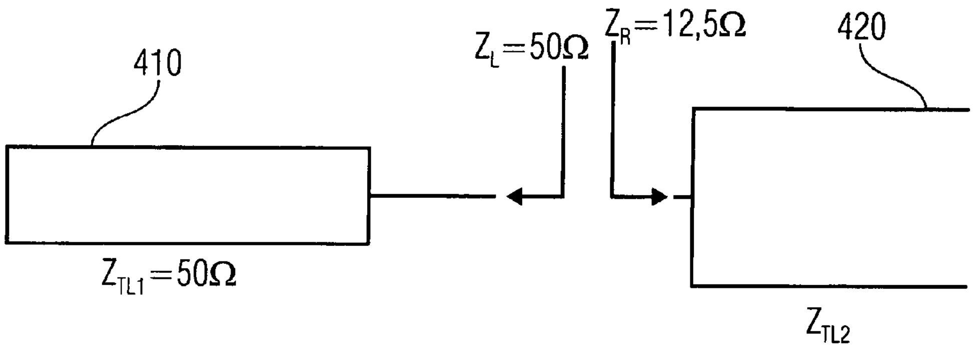

In the following, the concept of impedance matching will briefly be explained taking reference to FIGS. 4*a*, 4*b* and 4*c*. FIGS. 4*a*, 4*b* and 4*c* show a graphical representation of different impedances present at the node, for example present at the node 120 or the node 214. As an example, a case will be analyzed in which the first transmission line or first signal guiding structure comprises an impedance $Z_{TL1}$=50Ω, and in which the second transmission line or second signal guiding structure comprises an impedance $Z_{TL2}$=12.5Ω.

Taking reference to FIG. 4*c*, a reflection factor p is shown for a case in which the first transmission line 410 is directly coupled without any additional matching measures to the second transmission line 420. Under the above-described assumptions for the characteristic impedances, a reflection factor of ρ=0.6 is obtained.

Taking reference now to FIG. 4*a*, the transmission of a signal will be discussed, which is traveling towards a node 430 via the first transmission line 410. An impedance $Z_R$ at the node 430, side-viewed from the first transmission line 410, is equal to 7.1 Ohms. Said impedance $Z_R$ can for example be calculated as an impedance of a parallel circuit comprising the resistor $R_M$ and an impedance of the second transmission line 420. Accordingly, a reflection factor for a wave (representing a signal) traveling towards the node 430 via the first transmission line 410 can be computed to be 0.75, as shown in FIG. 4*a*. Thus, the presence of the resistor 424 increases a mismatch for a wave traveling towards the node 430 via the first transmission line 410. While a reflection coefficient ρ for such a wave is 0.6 in the absence of the resistor 424, the reflection coefficient reaches a value of 0.75 in the presence of the resistor 424, as shown in FIG. 4*a*.

However, taking reference now to FIG. 4*b*, a matching will be analyzed for a wave traveling towards a node 430 via the second transmission line 420. An impedance $Z_L$ at the node 430, side-viewed from the second transmission line 420, can be computed to be 12.5Ω. Said impedance at the node can be computed by considering the parallel circuit of the first transmission line 420 and the impedance of the resistor 424. As the characteristic impendence of the second transmission line 420 is also equal to 12.5Ω, a reflection factor at the node 430 for a wave traveling toward the node 430 via the second transmission line 420 is reduced down to zero in an ideal case.

However, it should be noted that the values shown here are to be considered as examples only. It should also be noted that in a real environment, a reflection coefficient for a wave traveling towards the node 430 via the second transmission line 420 can not normally be reduced down to zero. However, in some embodiments the reflection factor of such a wave traveling towards the node 430 can be reduced such that a magnitude of the reflection factor ρ is smaller than 0.3, or even smaller than 0.1.

It can also generally be said that the resistor 424 is configured to match the impedance at the node, side-viewed from the second transmission line 420, to the second impedance, i.e. to reduce a magnitude of the reflection factor ρ when compared to a case in which the resistor 424 is not present. In contrast, the presence of the resistor 424 typically increases the magnitude of the reflection coefficient ρ for a wave traveling towards the node 430 via the first transmission length 410, as shown in FIG. 4*a*. In other words, the resistor 424 increases a mismatch between an impedance at the node 430, side-viewed from the first transmission line 410, and the characteristic impedance of the first transmission line 410.

Figure 5:
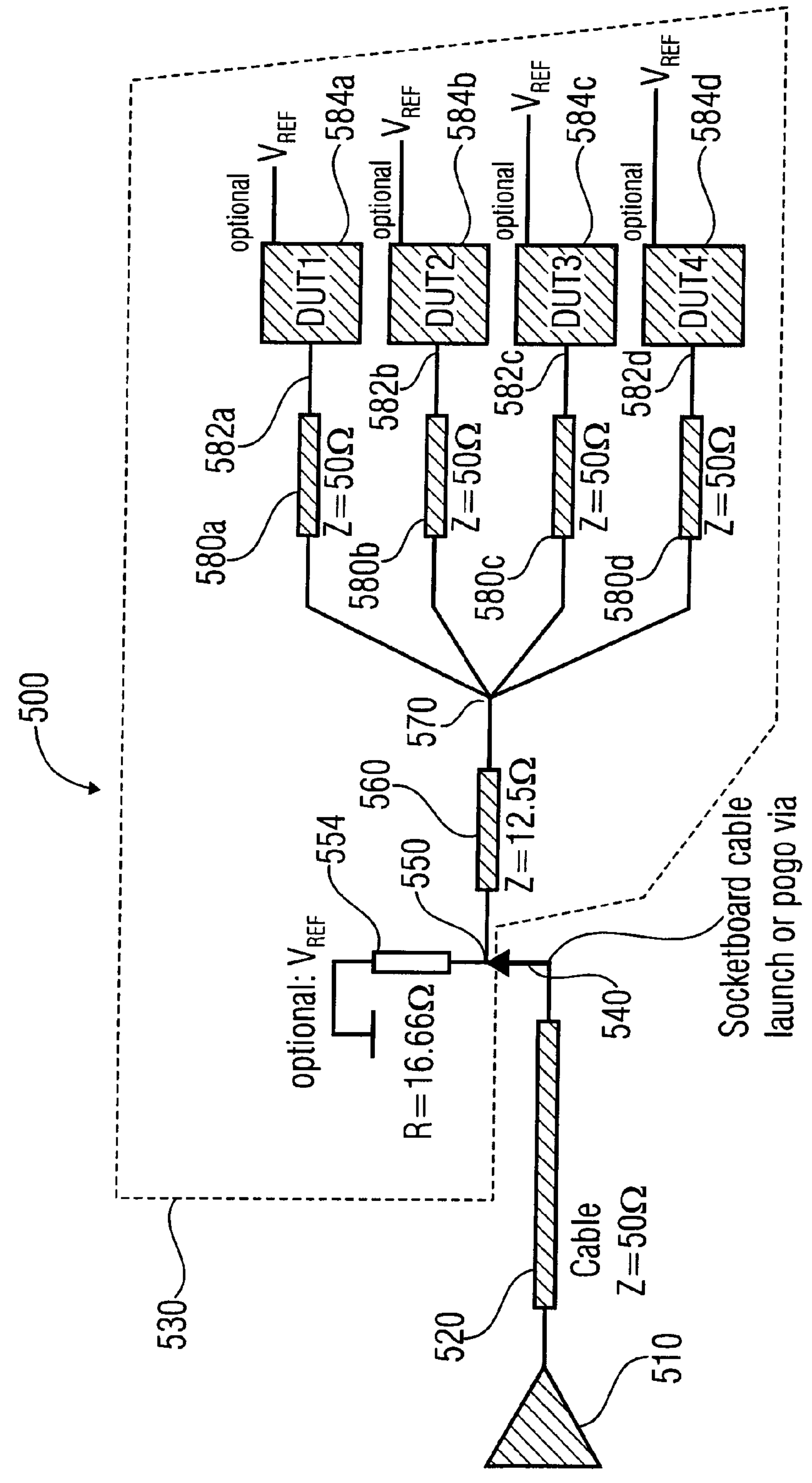
FIG. 5 shows a block schematic diagram of a signal distribution structure according to an embodiment of the invention.

Taking reference now to FIG. 5, another embodiment according to the invention will briefly be described. FIG. 5 shows a block schematic diagram of a signal distribution structure, according to an embodiment according to the invention. This signal distribution structure shown in FIG. 5 is designated in its entirety with 500. The signal distribution structure 500 comprises a driver or buffer 510, an output of which is connected to a cable 520, which may for example comprise a characteristic impedance Z=50Ω, and which cable may serve as a first transmission line. The cable 520 may for example be coupled to a device-under-test board 530 via a socketboard cable launch or a pogo via 540. A resistor 554 comprising a resistance of, for example, R=16.66Ω may for example be coupled to a node 550. While a first terminal of the resistor 554 is coupled to the node 550, a second terminal of the resistor 554 may be coupled to either a ground potential or to a power supply. The second terminal of the resistor 554 may in some embodiments be coupled to a device power supply of a device tester, such that a voltage $V_{REF}$ is provided to the second terminal of the resistor 554.

The device-under-test board 530 may for example comprise a second transmission line 560, which second transmission line may for example comprise a characteristic impedance of Z=12.5Ω. An end of the second transmission line 560 may for example be coupled to a branching node 570. A plurality of branch transmission lines 580*a* to 580*d* may connect the branching node 570 with the device-under-test connections 582*a* to 582*d* of a plurality of devices under test 584*a* to 584*d*. In an embodiment, one branch transmission line 580*a* to 580*b* may be provided per device under test 584*a* to 584*d*. However, in some other embodiments a plurality of devices under test may be provided with input signals via a single one of the branch transmission lines 580*a* to 580*d*. A length of the second transmission line 560 may be zero. In other words, the second transmission line 560 can be omitted.

To summarize the above, in the embodiment shown in FIG. 5, a Y-sharing by-4 with 50Ω printed circuit board traces (PCB traces) 580*a*-580*d* can be implemented.

To further summarize, some embodiments according to the invention are capable of avoiding at least some of the above-described disadvantages of the conventional Y-sharing topology, while keeping the key advantages.

In some embodiments according to the invention, one or more of the following effects can be obtained:

- no reflection when symmetry is achieved;
- by-4 sharing is possible;
- all traces or at least most of the traces can be manufactured in a 50Ω standard printed circuit board process with standard stackup;
- an additional resistor is added to a trace via that already exists; accordingly an additional signal degradation can be avoided; and
- all inputs (for example inputs of devices-under-test) are sourced from 50Ω. This may result in good rise times.

In some embodiments in accordance with the invention, the following compromise may occur:

- maximum levels may drop by a factor of 4; however, the maximum levels may in some embodiments still meet the requirements of the double-data-rate 3 specification (DDR-3 spec); and
- in some embodiments, a termination to a reference voltage Vref is useful; however, a device power supply (DPS) may be reused.

In some embodiments, the devices-under-test may be chips comprising a terminal for a reference voltage Vref. In such an embodiment, a terminal of the resistor 554, which is opposite to the node 550, may be connected to said reference voltage. The reference voltage supplied to the devices-under-test may for example be used by the devices-under-test to distinguish the different logic levels. In other words, the reference voltage may for example be used by the devices-under-test to determine the threshold level for discerning between the different logic levels. Thus, by applying said reference voltage Vref to one terminal of the resistor 554, the signal transmission path (comprising the cables 520, the connection 540, and the transmission lines 560, 580*a* to 580*d*) may be biased in an efficient manner, such that reliable input levels can be applied to the inputs of the devices-under-test 584*a* to 584*d*, in spite of an attenuation effect caused by the matching concept described herein.

In some embodiments according to the invention, all Y-sharing branches may branch off from one point (which may also be designated as a branch point) with 50Ω impedance traces. In some embodiments, to match the joint impedance of the branches (all of the Y-sharing branches 580*a* to 580*d*), the sourcing trace (for example the transmission line 560) may have ¼ th of the branch impedance.

In some embodiments, to achieve back matching, the resistance in parallel to the driver cable impedance (for example an impedance of a parallel circuit of the cable 520 and the resistor 554) may have (at least approximately) the same impedance as the joint impedance of the branches (which may be equal to ¼ th of an individual branch impedance).

To summarize some of the aspects according to the present invention, a Y-sharing socketboard printed circuit board can be made "manufacturable" for higher sharing degree using the concept in accordance with the invention. For example, a Y-sharing socketboard may be designed for a by-4 sharing.

Simultaneously, the Y-sharing socketboard becomes suitable for high speed, due to the lower 50Ω branch impedance.

When a high symmetry is achieved (for example in the case of a low device-under-test input capacitance variation and in the case of a matched trace length), a significant increase in speed may be expected due to smaller reflections when compared to a Daisy-Chain topology.

According to some embodiments, the solution may fit the DDR3 and DDR4 minimum level requirements.

According to some embodiments, a level situation may become even better with future automated test equipment products, wherein the drivers (for example the driver 510) may provide a larger level when compared to that of drivers of conventional automated test equipment products.

Figure 6:
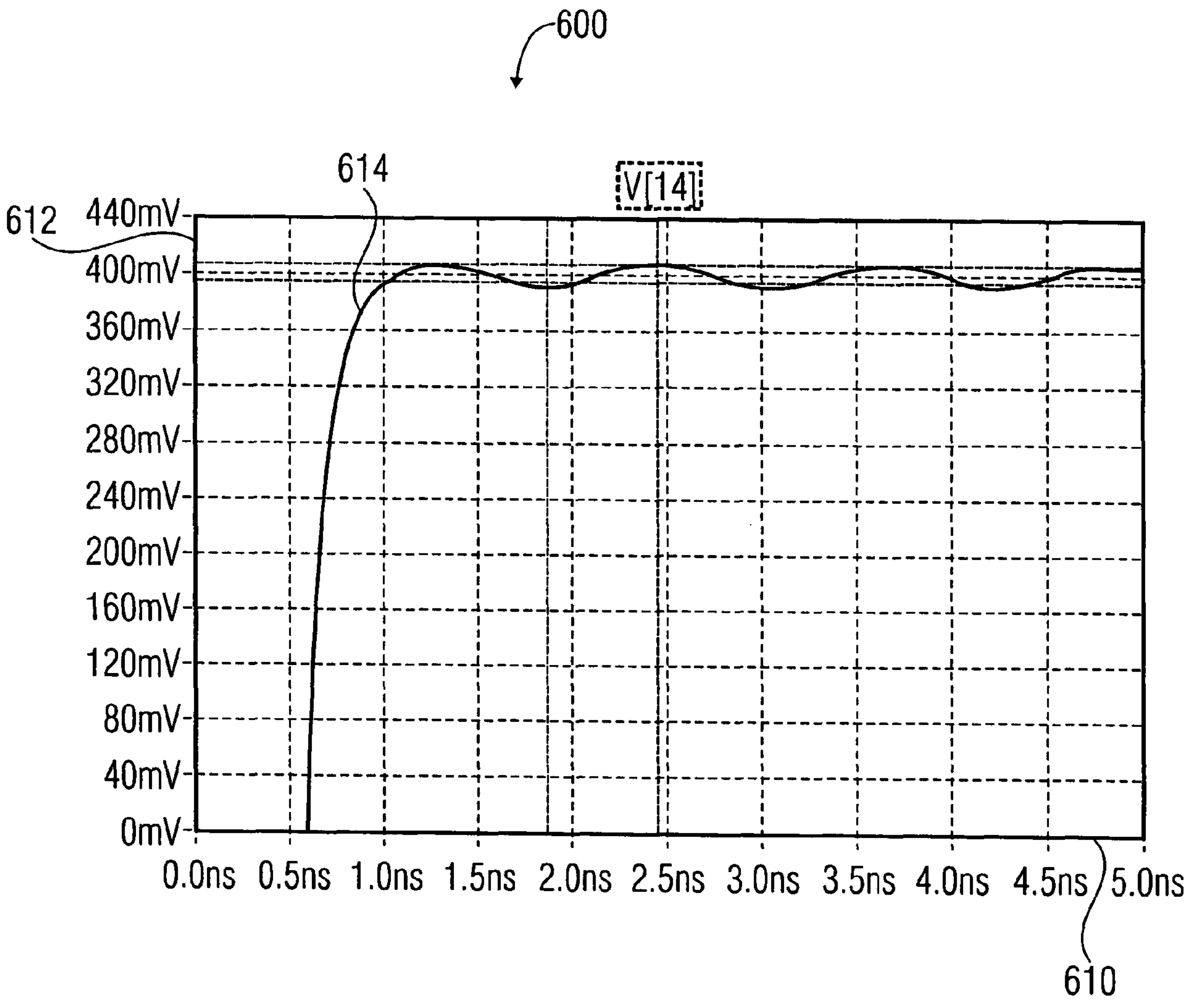
FIG. 6 shows a graphical representation of a signal, which may be present in the signal distribution structure according to FIG. 5.
Figure 7A:
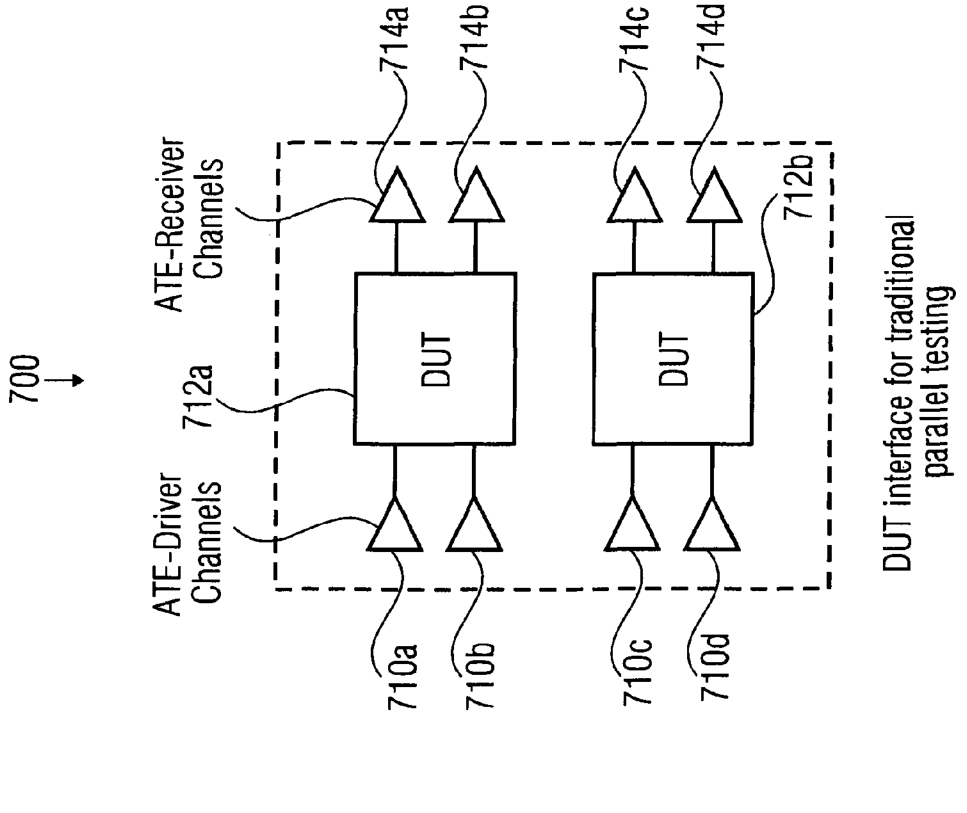
FIG. 7*a* shows a block schematic diagram of a device-under-test interface for traditional parallel testing.
Figure 7B:
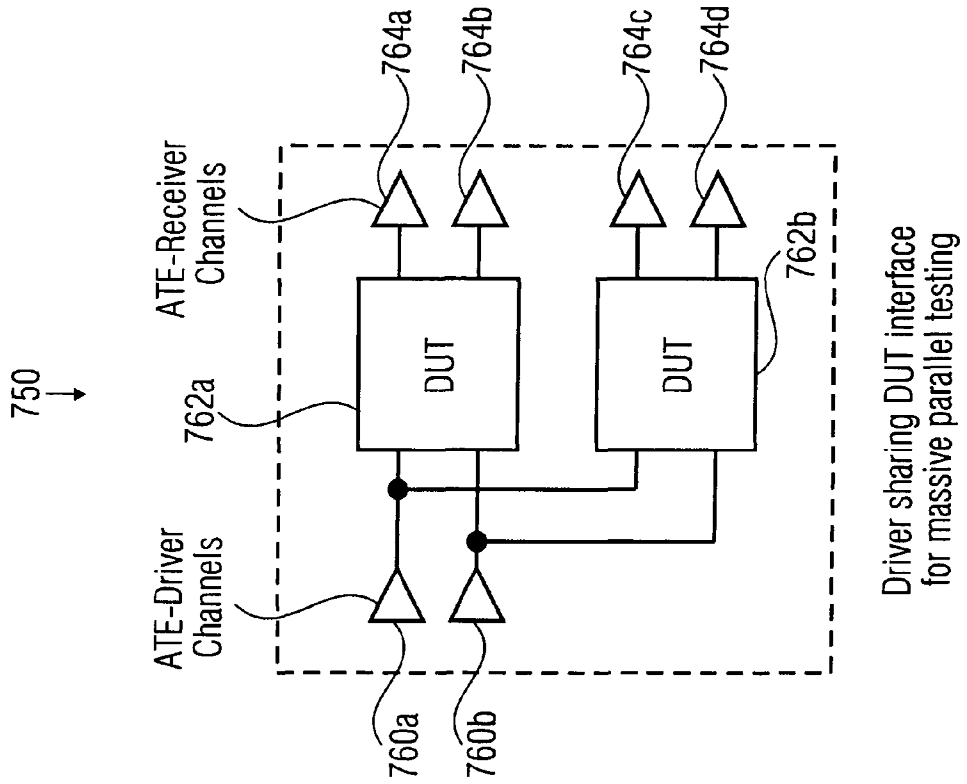
FIG. 7*b* shows a block schematic diagram of a driver sharing device-under-test interface for massive parallel testing.

In the following, some simple spice simulation results for a lossless case will be described making reference to FIG. 6. FIG. 6 shows a graphical representation 600 of simulation results. An abscissa 610 describes a time within a range between 0 and 5 nanoseconds. An ordinate 610 describes a voltage in a range between 0 and 440 mV. A curve 614 describes a temporal evolution of a voltage at an input of one of the devices-under-test 584*a* to 584*d*. It is assumed that the driver 510 drives a pulse having a swing of 1.6 V and a rise time of 1 picosecond. It is also assumed that the driver 510 comprises an impedance of 50Ω. Moreover, it is assumed that the cable 520 and the transmission lines 560, 580*a* to 580*d* have impedances as shown in FIG. 5. Besides, it is assumed that the electrical length of the cable 520 and of the transmission lines 560, 580*a* to 580*d* is such that the transmission lines comprise a time delay of 200 picoseconds. It is also assumed that the resistor 554 has a resistance of 16.66Ω.

A slight difference of the input capacitances of the devices under test 584*a* to 584*d* is considered. For example, it is assumed that the first device-under-test 584*a* has an input capacitance of 2.1 pF, while the other devices-under-test 584*b* to 584*d* comprise an input capacitance of 2 pF.

As can be seen from the graphical representation 600, the temporal evolution of the input signal shown by the curve 614 reaches a level of 400 mV, approximately 1 nanosecond after the pulse provided by the driver 510. It can also be seen that after a time T=1.0 nanosecond, a variation of the device-under-test input voltage shown by the curve 614 is relatively small, even in the presence of a small difference of the input capacitances of the devices-under-test.

To summarize the above, in some embodiments according to the invention, for example in the embodiment shown in FIG. 5, less than 5% ringing can be achieved for a 5% input capacitance asymmetry. A swing (for example a swing of a device-under-test input voltage) may be reduced to ¼ th of a programmed value (or ¼ th of a swing provided by the driver 510). In many applications, such a characteristic fulfills the useful specifications very well.

Figure 12:
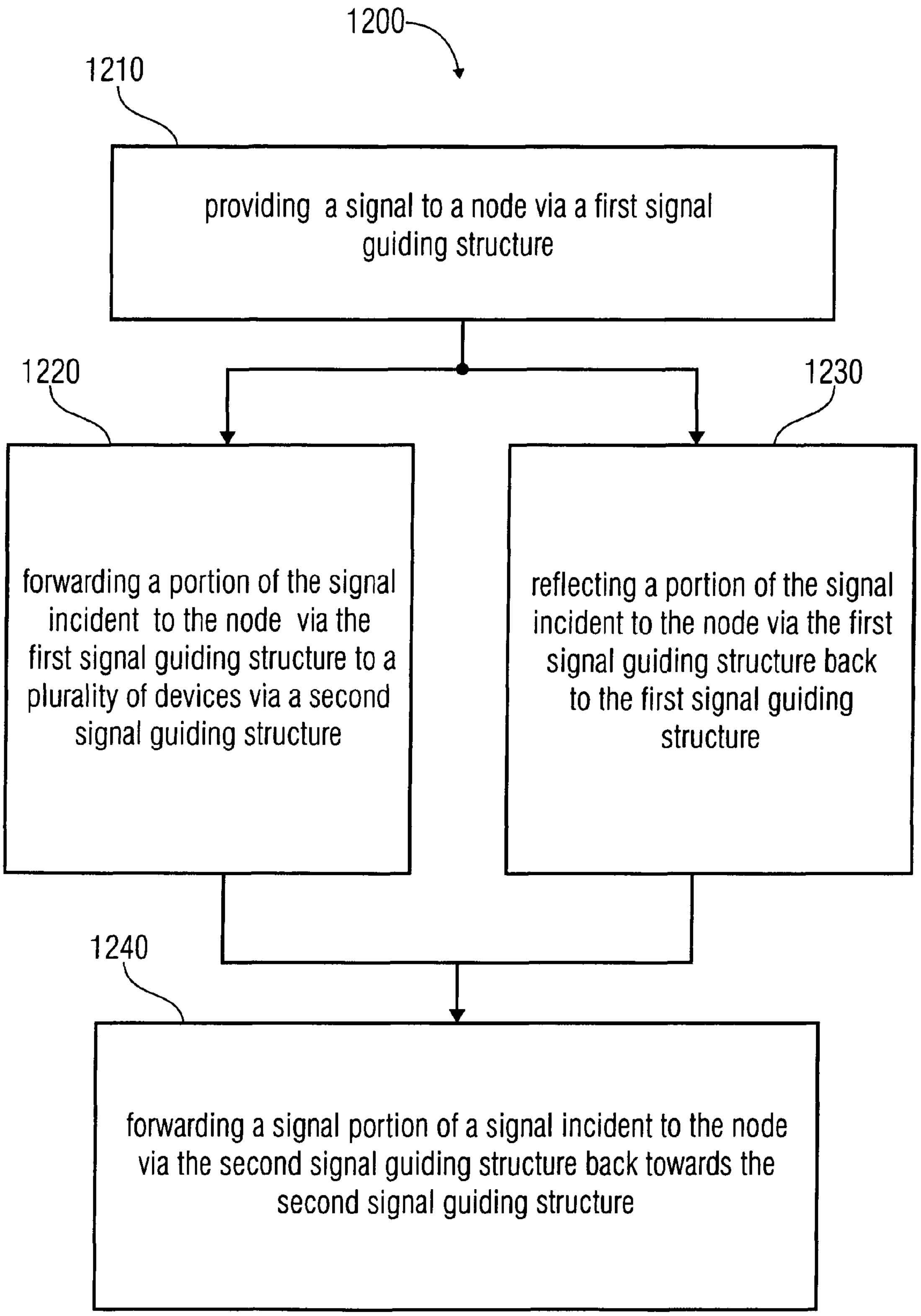
FIG. 12 shows a flow chart of a method for distributing a signal to a plurality of devices according to an embodiment of the invention.

In the following, a method for distributing a signal from a driver to a plurality of devices will be described taking reference to FIG. 12. FIG. 12 shows a flow chart of such a method. The method shown in FIG. 12 is designated in its entirety with 1200. The method 1200 comprises providing 1210 a signal to a node via a first signal guiding structure comprising a first characteristic impedance. The method 1200 also comprises forwarding 1220 a portion of the signal incident to the node via the first signal guiding structure to a plurality of devices. The portion of the signal is forwarded to the devices via the second signal guiding structure. The method also comprises reflecting 1230 a portion of the signal incident to the node via the first signal guiding structure, back to the first signal guiding structure.

The method 1200 also comprises forwarding 1240 a signal portion incident to the node via the second signal guiding structure, to the first signal guiding structure and to the matching element, while suppressing a reflection of the reflected signal portion incident to the node via the second signal guiding structure back towards the second signal guiding structure. It should be noted that the method 1200 can be supplemented by any of the functionalities described herein.

Figure 13:
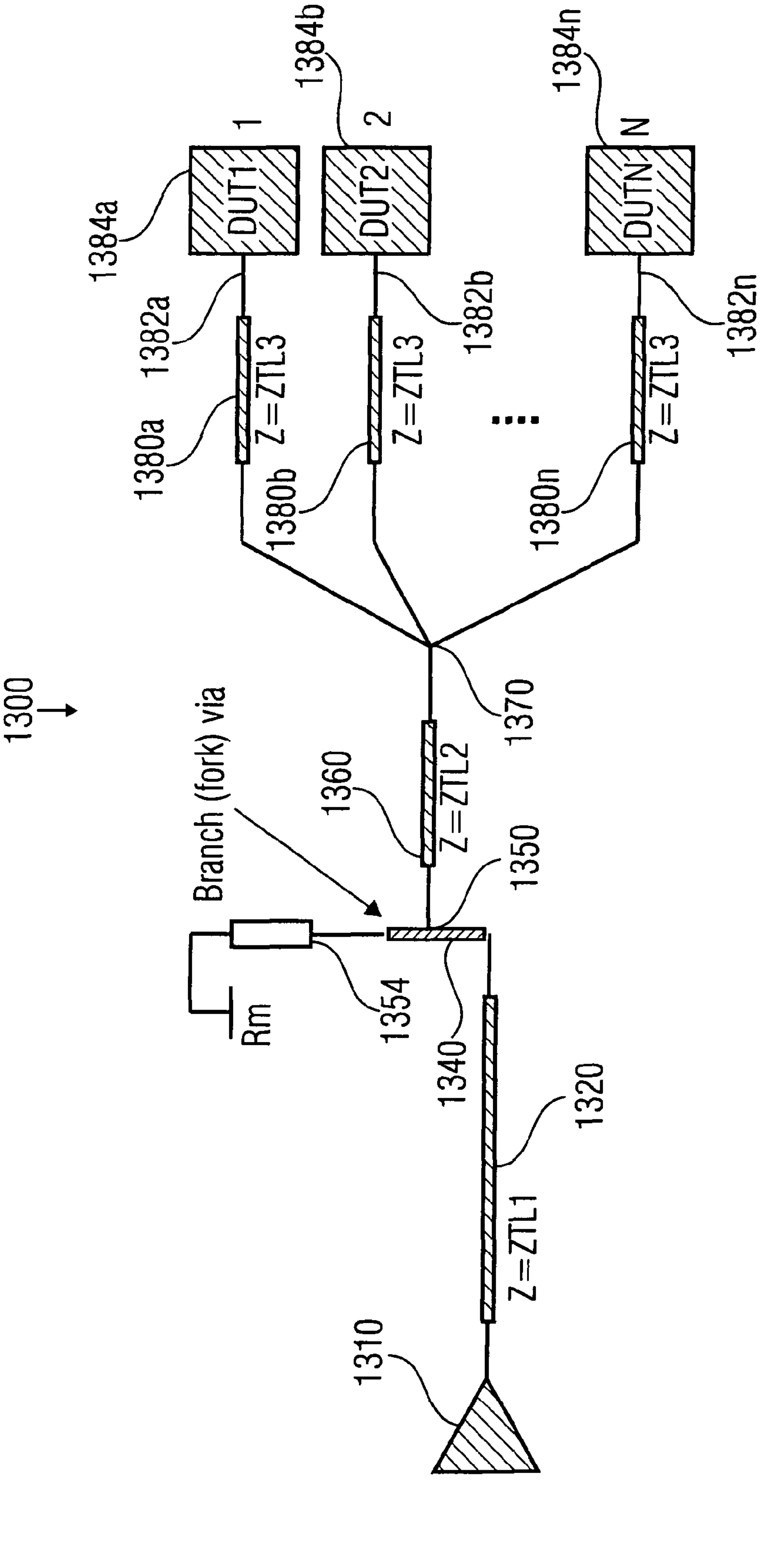
FIG. 13 shows a block schematic diagram of a Y-sharing topology.

FIG. 13 shows a block schematic diagram of a Y-sharing topology. The topology shown in FIG. 13 is designated in its entity with 1300. The topology shown in FIG. 13 may for example be applied in a Y-sharing by-N with arbitrary impedance branch traces.

The Y-sharing topology 1300 is very similar to the Y-sharing topology described with reference FIG. 5. Accordingly, means and signals having the same functionality will not be explained again here.

The Y-sharing topology 1300 comprises a driver or buffer 1310 (which is similar to the driver or buffer a 510), a cable 1320 (which is similar to the cable 520), a branch-via or fork via 1340, a resistor 1354 (which is similar to the resistor 554), a second transmission line 1360 (which is similar to the second transmission line 560) and a branching node 1370 (which is comparable to the branching node 570). Moreover, the Y-sharing topology 1300 comprises N branch transmission lines 1380*a* to 1380*n*. The N branch transmission lines 1380*a* to 1380*n* are circuited between the branching node 1370 and the device connections 1382*a* to 1382*n*. The device-under-test connections 1382*a* to 1382*n* may be equivalent to the device connections 582*a* to 582*d*. Moreover, devices 1384*a* to 1384*n* may be connectable, or may be connected, to the device connections 1382*a* to 1382*n*.

In the Y-sharing topology 1300, a first end of the branch via 1340 may for example be coupled to the driver or buffer 1310 via the cable 1320, which cable may serve as a first transmission line. The cable or first transmission line 1320 may for example comprise a characteristic impedance ZTL1. A second end of the branch via 1340 may for example be coupled to a first terminal of the resistor 1354. A second terminal of the resistor 1354 may be coupled to a reference potential or grounded potential, or to another fixed potential. A tap 1350 of the branch via or fork via 1340 may be coupled with the branching node 1370 via the second transmission line 1360. The second transmission line 1360 may comprise a characteristic impedance ZTL2. Further, the branch transmission lines 1380*a* 1380*n* comprise a characteristic impedance ZTL3.

It has to be noted that in the embodiment shown in FIG. 13, there are N branches (for example N branch transmission lines 1380*a* to 1380*n*) and N devices are under test DUT) 1384*a* to 1384*n*. In an advantageous embodiment there are, for example, 2 branches and 2 devices under test. However, in another advantageous embodiment, there are 4 branches and 4 devices under test.

However, different numbers of branches and devices under test can be used as well.

In an embodiment according to invention, the following conditions may be given or fulfilled;

$$0<ZTL3<ZTL1*N$$

$$ZTL2=ZTL3/N; \text{ and}$$

$$Rm=(ZTL1*ZTL2)/(ZTL1-ZTL2).$$

In a typical embodiment, the characteristic impedance of the first transmission line 1320, which is designated with ZTL1, may be equal to 50 Ohm (ZTL1=50 Ohm). Also, in a typical embodiment, the characteristic impedance of the branch transmission lines 1380*a* to 1380*n*, also designated with ZTL3, may lie within a range between 0 and 100 Ohm (0≤ZTL3≤100 Ohm).

However, other ranges for the characteristic impedances may be used in some other embodiments.

Also, in some embodiments the length of the second transmission line 1360 may be short. In some embodiments, the length of the second transmission line 1360 may even be 0. In other words, the second transmission line 1360 may be omitted in some embodiments.

Figure 14:
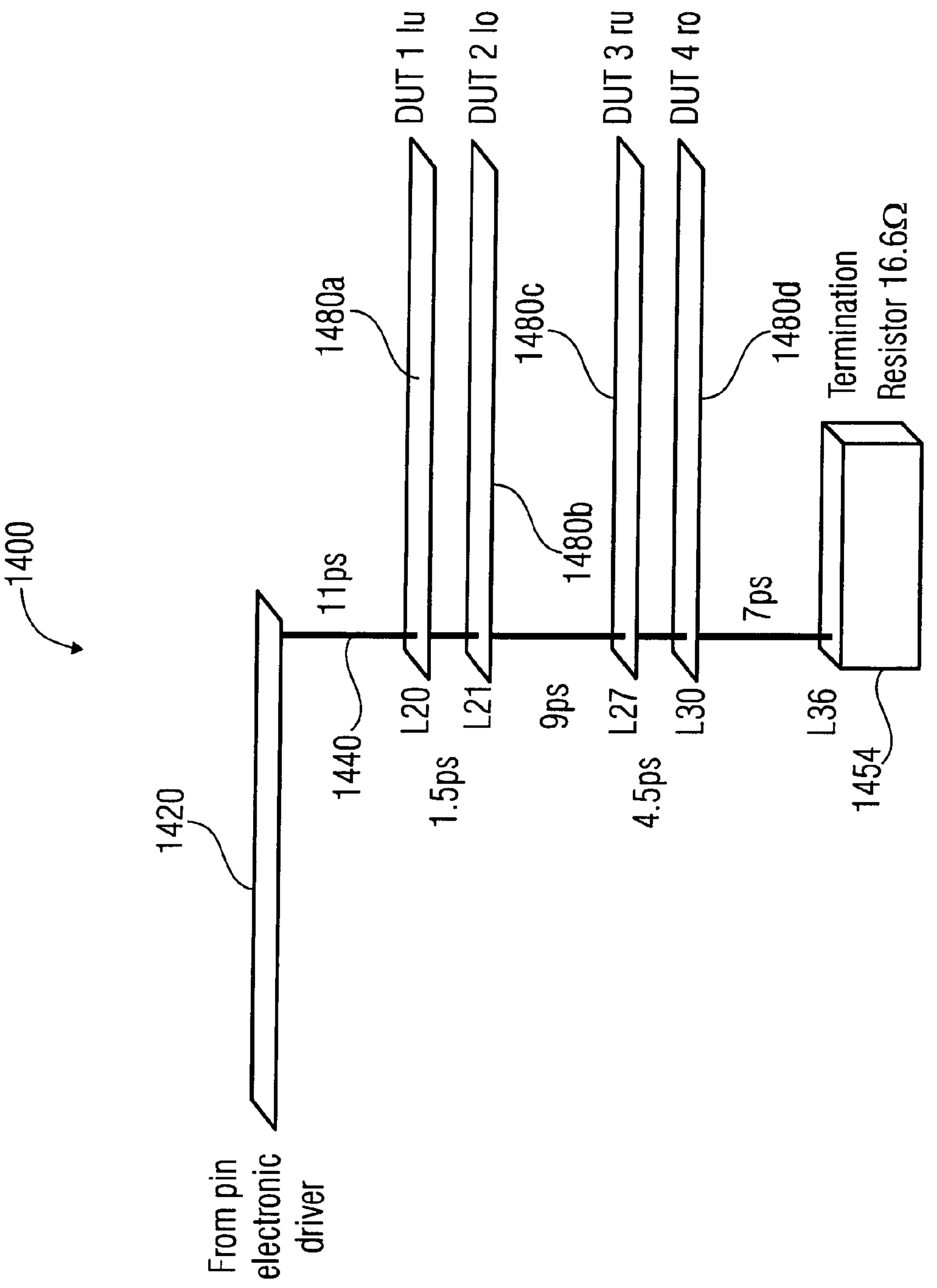
FIG. 14 shows a schematic representation of a physical structure for implementing a branch on a multi-layer printed circuit board using a via according to an embodiment of the invention.

In the following, possible implementation of a fork via structure will be described taking reference to FIG. 14. FIG. 14 shows a schematical representation of a fork via structure, according to an embodiment of the invention. The fork via structure shown in FIG. 14 is designated in its entity with 1400. It should be noticed here that the fork via structure 1400 represents a case in which a length of the second transmission line 1360 is 0. Accordingly, the branch transmission lines 1380*a* to 1380*n* directly branch from the fork via 1440.

The structure 1400 comprises a first transmission line 1420, which may be equivalent to the first transmission line 1320. Moreover, the fork via structure 1400 comprises a branch via or a fork via 1440, which may for example be equivalent to the fork via 1340 shown in FIG. 13. The fork via 1440 may for example extend vertically through a multi-layer printed circuit board. The layers of the multi-layer printed circuit board are not shown in FIG. 14 for the sake of simplicity. However, different branch transmission lines 1480*a* to 1480*d* may be coupled to the fork via 1440, as shown in FIG. 14. A termination resistor (also designated as “fork resistor”) 1454, which may be equivalent to the resistor 1354, may be coupled to the fork via 1440. In the embodiment shown in FIG. 14, the first transmission line 1420 may for example be arranged on a first surface (for example a top surface, or a bottom surface) of the multi-layer printed circuit board. The termination resistor or fork resistor 1454 may be arranged on a second surface (or main surface) of the multi-layer printed circuit board, which second surface may be opposite to the first surface. Thus, the branch via or fork via 1440 may extend, for example, through the multi-layer printed circuit board, from the top surface to the bottom surface. The first branch transmission line 1480*a* may for example be arranged between two spacing layers or dielectric layers of the multi-layer substrate, for example between a first spacing layer (or dielectric layer) and a second spacing layer (or dielectric layer). Further, the second branch transmission line 1480*b* may, for example, be arranged between a second spacing layer (or dielectric layer) of the multi-layer printed circuit board and a third spacing layer. The third branch transmission line 1480*c* for example be arranged between the third spacing layer of the multi-layer printed circuit board and a fourth spacing layer of the printed circuit board. The fourth branch transmission line 1480*d* may be arranged between the fourth spacing layer of the printed circuit board and a fifth spacing layer of the printed circuit board. Thus, different branch transmission lines 1480*a* to 1480*d* may be arranged on different metallisation layers of the multi-layer printed circuit board, and may be mutually spaced by one or more dielectric layers.

However, the structure shown in FIG. 14 may be significantly modified. For example, two or more of the branch transmission lines may be arranged in the same metallisation layer of the multi-layer printed circuit board. Also, the termination 1454 may for example be arranged on the same layer as the first transmission line 1420. Further, in some embodiments, the termination resistor 1454 may even be embedded in the multi-layer printed circuit board, for example if a technology is used which allows the embedding of resistors within multi-layer structures.

However, it should be noted that in the fork via implementation shown in FIG. 14, there is some propagation delay (or propagation delay difference) between the different branches (for example between the different branch transmission lines 1480*a* to 1480*d*). The propagation delay difference is caused, by the asymmetric fork via. For example, a propagation delay between the first transmission line 1420 (or the via-sided end thereof) and the first branch transmission line 1480*a* (or the via-sided end thereof) may be approximately 11 picoseconds, a propagation delay between the first branch transmission line 1480*a* and the second branch transmission line 1480*b* may be 1.5 picoseconds, a propagation delay between the second branch transmission line 1480*d* and the third branch transmission line 1480*c* may be approximately 9 picoseconds, a propagation delay between the third branch transmission line 1480*c* and the fourth branch transmission line 1480*d* may be approximately 7 picoseconds, and a propagation delay between the fourth branch transmission line 1480*d* and the termination resistor 1454 may be approximately 7 picoseconds.

The propagation delays between the different branches (more precisely, between the fork-via-ends of the branch transmission lines 1480*a* to 1480*d*) caused by the "asymmetric" via (or the asymmetric layer structure) may somewhat degrade a performance.

However, the structure shown in FIG. 14 is usable for a distribution of signals, depending on the specific requirements.

Figure 15:
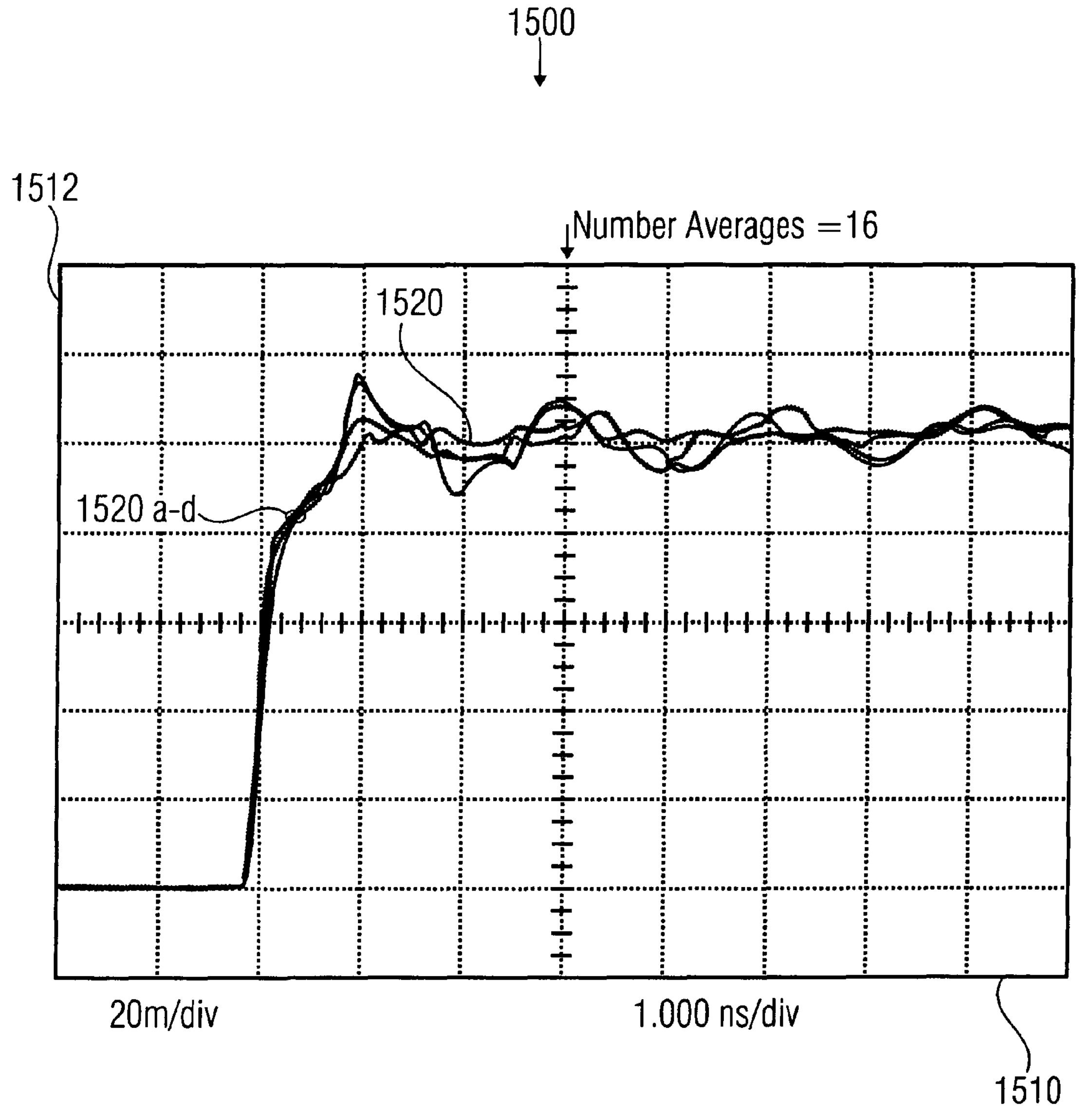
FIG. 15 shows a graphical representation of measured signals obtained using a structure shown in FIG. 14.

FIG. 15 shows a graphical representation of device-under-test signals, which can be obtained using, for example, the structure shown in FIG. 14. The graphical representation shown in FIG. 15 is designated in its entirety with 1500. An abscissa 1510 describes a time in units of 1 nanosecond per division. An ordinate 1512 describes a level of a device-under-test signal, provided to a device-under-test via one of the branch transmission lines (for example branch transmission lines 1480*a* to 1480*d*). Curves 1520*a* to 1520*d* describe signals arriving at device-under-test connections for different devices under test. It can be seen from the graphical representation 1500, that some ringing can be observed at the device-under-test connections. This ringing is caused by multiple reflections. Some of the multiple reflections may be caused by the asymmetry of the fork via structure 1400.

To summarize, FIG. 15 shows step responses measured on the ball grid array (BGA) pads of the four devices under test (DUTs) showing the result of the via asymmetry. A curve or trace 1520 shows the signal at the best site (site number 1), for example at a device-under-test site connected to the branch via or fork via using the "uppermost" branch transmission line 1480*a*, which is routed in the "uppermost" branch layer.

Figure 16:
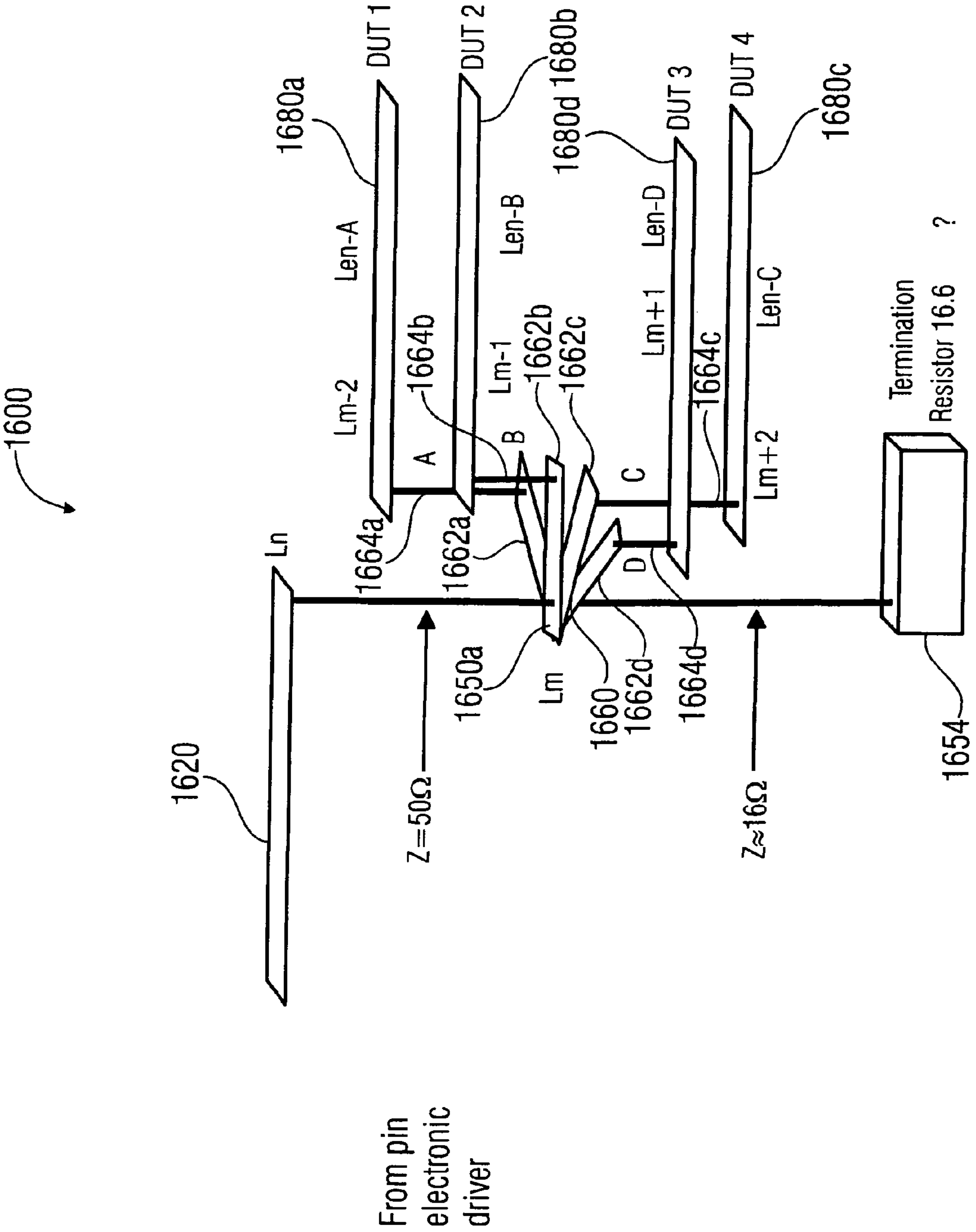
FIG. 16 shows a schematic representation of a physical structure for implementing a branch on a multi-layer printed circuit board, according to an embodiment of the invention.

FIG. 16 shows a schematic representation of another fork via structure, according to an embodiment of the invention. The fork via structure shown in FIG. 16 is designated in its entity with 1600. The fork via structure 1600 comprises a first transmission line 1620, which may be equivalent to the first transmission line 1320 described with reference to FIG. 13. The fork via structure 1600 further comprises a first via 1650. The first via 1650 may for example extend through a plurality of layers of a multi-layer printed circuit board (not shown for the sake of simplicity). In an embodiment, the first via 1650 may even extend from a first main surface (for example a top surface, or a bottom surface) of the multi-layer printed circuit board towards a second main surface of the multi-layer printed circuit board (for example a bottom surface, or a top surface), wherein the second main surface of the printed circuit board may be arranged opposite to the first main surface of the printed circuit board. The fork via structure 1600 may further comprise a termination resistor or fork resistor 1654, which may for example comprise a resistance of 16.6Ω. In an embodiment, a first end of the first via 1650 may be coupled to the first transmission line 1620, and a second, opposite end of the first via 1650 may be coupled to the termination resistor 1654.

The fork via structures 1600 may further comprise a signal distribution structure 1660. The signal splitting structure 1660 may comprise a plurality of conductive traces 1662*a* to 1662*d*. The conductive traces 1662*a* to 1662*d* may for example be arranged in a common conductive layer of the multi-layer printed circuit board. The different conductive traces 1662*a* to 1662*d* may for example be coupled to the fork via 1650, and may for example extend outwardly from the fork via 1650 into different directions.

However, different geometrical arrangements of the signal splitting structure 1660 may be used. For example, the signal splitting structure 1660 may for example comprise a relatively short common conductor, which is coupled between the fork via 1650 and a branching point, from which branches extend in different directions.

Moreover, the fork via structure 1600 comprises a plurality of branch transmission lines 1680*a* to 1680*d*. For example, the branch transmission line 1680*a* to 1680*e* may be equivalent to the branch transmission lines 1380*a* to 1380*n*. In an embodiment, the signal splitting structure 1660 may be arranged in a layer between the first end of the fork via 1650 and the second end of the fork via 1650. For example, the signal splitting structure 1660 may be arranged in a layer Lm of the multi-layer printed circuit board, which layer Lm is arranged between a layer Ln on which the first transmission line 1620 is formed, and a layer on which the resistor 1654 is arranged. In other words, the signal splitting structure 1660 may be formed on one of the inner layers of the multi-layer printed circuit board.

Furthermore, the conductive traces 1662*a* to 1662*d* may be connected to the branch transmission lines 1680*a* to 1680*d* using vias 1664*a* to 1664*d*. For example, one or more of the branch transmission lines (for example the branch transmission line 1680*a*, 1680*b*) may be arranged in a layer of the multi-layer printed circuit board which is on one side (for example above, or below) the layer Lm in which the signal splitting structure 1660 is arranged. Moreover, one or more of the branch transmission line (for example branch transmission lines 1680*c*, 1680*d*) may be arranged in one or more layers located on a second side (for example below, or above) the layer Lm, in which the signal splitting structure 1660 is arranged.

Assuming for example that the multi-layer printed circuit board comprises a sequence of conductive layers designated with Lm−2, Lm−1, Lm, Lm+1, Lm+2, in the given order shown in FIG. 16, the first branch transmission line 1680*a* may be arranged in the layer Lm+2, the second branch transmission line 1680*b* may be arranged in the layer Lm−1, the signal splitting structure 1660 may be arranged in the layer Lm, the third branch transmission line 1680*c* may be arranged in the layer Lm+2, and the fourth branch transmission line 1680*d* may be arranged in the layer Lm+1, as shown in FIG. 16. Thus the layer Lm may be arranged between the layers Lm−1, Lm+1 in which the second branch transmission line 1680*b* and the fourth branch transmission line 1680*d* arranged.

Similarly, the layer Lm, in which the signal splitting structure 1660 is arranged, may be arranged between the layers Lm−2 and Lm+2, in which the first branch transmission line 1680*a* and the third branch transmission line 1680*c* are arranged, as shown in FIG. 16.

Accordingly, branch transmission lines are arranged on different sides with respect to the layer LM in which the signal splitting structure 1660 is arranged. Accordingly, propagation delay differences of signals propagating from the first transmission lines 1620 to the different branch transmission lines 1680*a* to 1680*d* can be reduced, for example when compared to the structure 1400 shown in FIG. 14.

For example in an embodiment there may be only two branch transmission lines, for the example the branch transmission lines 1680*a* and 1680*c*. Accordingly, the signal splitting structure 1660 may comprise only two branches. The two branch transmission lines 1680*a*, 1680*c* may be coupled with the branch via or fork via 1650 using the signal splitting structure 1660 and the additional vias 1664*a*, 1664*c*. In this case, propagation delay be between the first transmission line 1620 and a branch-via-sided end of the branch transmission line 1680*a* may be equal, for example within a tolerance range of +/−2 picoseconds to a propagation delay between the first transmission line 1620 and a branch-via-sided end of the branch transmission line 1680*c*. Further, in this case, only the conductive traces 1662*a*, 1662*c* of the signal splitting structure 1660 may be present, while the conductive structures 1662*b*, 1662*d* may be absent.

Using the above described arrangement, it can be achieved that the branch transmission lines 1680*a*, 1680*c* can be arranged on different layers of the multi-layer printed circuit board, while a propagation delay between the first transmission line 1620 and said branch transmission lines 1680*a*, 1680*c* is approximately identical.

In another embodiment, there may be actually four branch transmission lines 1680*a* to 1680*d*, as shown in FIG. 16. In this case, the four branch transmission lines 1680*a* to 1680*d* may be arranged on different layers of the multi-layer printed circuit board. Thus, a propagation delay between the branch via 1650 and the branch transmission line 1680*a* may be slightly higher than the propagation delay between the branch via 1650 and the branch transmission line 1680*b*, as the via 1664 corresponding to the first branch transmission line 1680*a* may be longer (extend through more layers of the multi-layer printed circuit board) than the via 1664*b* corresponding to the second branch transmission line 1680*b*. In other words, a vertical distance (for example measured in the direction of the vias 1664*a* to 1664*d*) between the first transmission line 1680*a* and the layer in which the signal splitting structure 1660 is arranged, may be larger than the distance between the second transmission line 1680*b* and the layer in which the signal splitting structure 1660 is arranged. Similar conditions may apply to the branch transmission lines 1680*c*, 1680*d*. Thus, the distance between the branch transmission line 1680*c* and the layer, in which the signal splitting structure 1660 is arranged, may be larger than the distance between the branch transmission line 1680*d* and the layer in which the signal splitting structure 1660 is arranged. Accordingly, a vertical length of the via 1664*c* may be larger than a length of the via 1664*d*.

However, using said arrangement the branch transmission lines 1680*a* to 1680*d* can be routed on different layers of the multi-layer printed circuit board. A sufficient signal integrity can be maintained, as propagation delay differences between the device-under-test sided ends of the branch transmission lines 1680*a* to 1680*d* and a coupling point 1650*a*, at which the branch transmission line paths split up, are kept small. In other words, using the branch via structure 1600 shown in FIG. 16, it can be achieved that signals reflected back from the device-under-test sided ends of the branch transmission lines 1680*a* to 1600*e* arrive at the branch via 1650 approximately simultaneously. Accordingly, the different signals reflected back at the device-under-test sided ends of the branch transmission lines may cancel out, which cancellation is supported by the resistor 1654. The quality of the cancellation is improved with decreasing temporal shift between the arrival times of the reflected signals at the point 1650*a*.

To summarize the above, an improved fork via structure or branch via structure 1600 has been described taking reference to FIG. 16, which brings along an even better cancellation of reflections than the fork via structure or branch via structure 1400 described with reference to FIG. 14.

In the following, a short comparisons will be given of the branch via structures 1400 and 1600. As can be seen, the branches or branch transmission lines 1480*a* to 1480*d* and 1680*a* to 1680*d* are arranged in different layers (of the multi-layered printed circuit board). However, in the branch via structure 1400, the branches are attached to the feeding line (first transmission line 1420) using a via. This structure causes an asymmetry in the signal propagation along the via in a vertical direction, which reduces a reflection cancellation (or which makes the reflection cancellation less effective, or even ineffective in the worst case). Accordingly, the structure 1400 brings along some degradation of signal integrity at some or all of the device-under-test sites. However, the structure 1400 can be used depending on the actual requirements with respect to signal integrity. Nevertheless, an improvement can be obtained using a structure 1600 shown in FIG. 16.

To summarize the above, FIG. 14 shows a possible implementation of the via (also designated as branch via or fork via) that connects the branches (for example the branch transmission lines 1480*a* to 1480*d*) to the feeding line (for example the first transmission line 1420). Layer numbers (for example L20, L21, L27, L30, L36) indicate the different layers. Propagation delay numbers (for example 11 ps, 1.5 ps, 9 ps, 4.5 ps, 7 ps) indicate the propagation delays between the layers. Even though the propagation delays are relatively small, the propagation delay may cause some distortion of the signal, in which the distortion can for example be seen in FIG. 15. A further improved design, which is shown in FIG. 16, therefore requests that the branches (for example the conductive traces 1662*a* to 1662*d*) to the devices under test are all done on the same printed circuit board layer (for example on the layer Lm).

Moreover, it should be noted that the termination resistor 1654 may also be designated as "fork resistor".

Also, the first transmission line 1420 may be considered as a feeding line, which may for example guide a signal from a so-called "pin electronic driver" channel module (for example from a channel module of a device tester) towards the branch via or fork via 1650.

Figure 17:
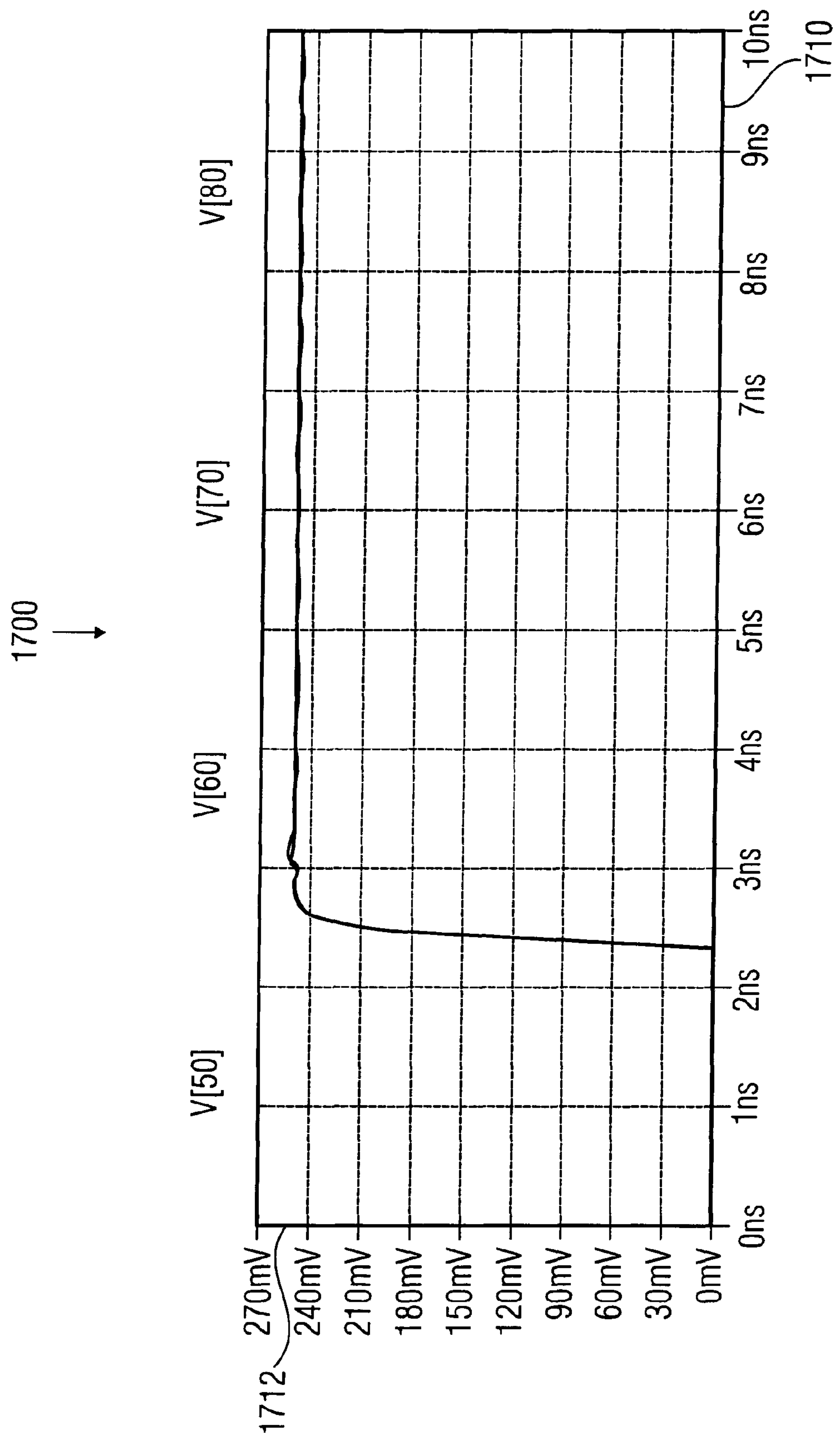
FIG. 17 shows a graphical representation of a simulated signal obtained using the structure shown in FIG. 15.

FIG. 17 shows a graphical representation of a simulation result of the branch via structure or fork via structure 1600 shown in FIG. 16. The graphical representation of FIG. 17 is designated in its entity with 1700. An abscissa 1710 describes a time in units of nanoseconds, and an ordinate 1712 describes a level of a signal measured at a device-under-test sided end of one of the branch transmission lines 1680*a* to 1680*d*.

As can be seen from FIG. 17, there is only a negligible ringing of the signal in response to a steep transition (between times t=2 ns and t=3 ns). A small ringing after the transition (which ringing can be seen between times t=2.8 nanoseconds and t=10 nanoseconds) indicates the high quality of the fork via structure 1600.

In the following, some further explanations will be given taking reference to FIGS. 18 to 28. Firstly, the concept of Y-sharing topology will be briefly explained with reference to FIGS. 18 and 19.

Figure 18:
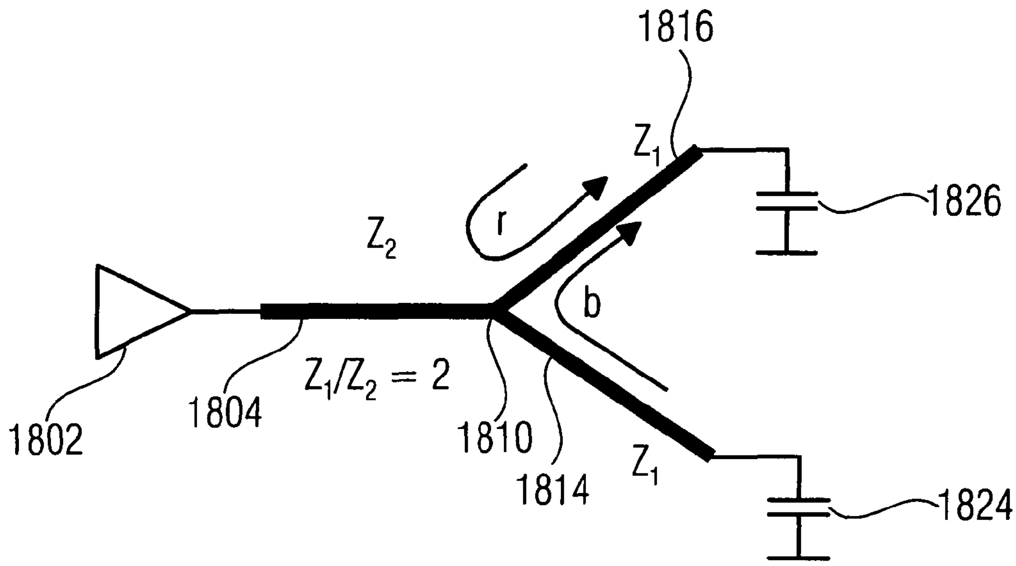
FIG. 18 shows a schematic diagram of a Y-sharing circuit configured for a canceling of reflected and refracted signal portions.

FIG. 18 shows a schematic representation of a Y-sharing circuit in which a canceling of reflected and refracted, signal portions occurs. An advantage of a Y-sharing is the fact that due to a symmetric circuit arrangement, reflections cancel out each other if the trace impedance is chosen properly. For example, when a signal propagates towards a fork point (for example a fork point 1810) the signal will be refracted into the two branches. For example, if a signal is traveling towards the fork point 1810 via a transmission line 1804 the signal will be refracted into the two branches 1814, 1816. When the branches 1814, 1816 are not terminated at the end, total reflection will occur in both branches. The reflection at the end of the branches 1814, 1816 will for example be dominated by input capacitances 1824, 1826 of the device-under-test input (of devices-under-test connected to the branches 1814, 1816) and looks like a short (or a reflection from a short) in the first instance of time, and like an open (or a reflection from an open) after the capacitances 1824, 1826 are charged.

When the reflections from both branch ends arrive again at the fork point 1810, a portion will be reflected back to the branch end again and another portion will be reflected into the feeding line and into the other branch end. If now the reflected portion from one branch end the refracted portion from the other branch end cancel out each other, this type of Y-sharing will work properly up to the highest speeds without any signal distortion. To achieve this, theoretical situation, a perfect symmetry between both branches 1814, 1816 may be used (for example with respect to a trace length and an impedance or input impedance of the device-under-test). Furthermore, a certain impedance ratio between the feeding line 1804 and the branch lines 1814, 1816 may be used to fulfill the reflection cancellation condition. These impedances can be calculated from transmission line theory.

The reflection coefficient r for the signal that propagates from the branch end to the fork point. 18 and the refraction coefficient b for the signal that is refracted into the other branch end are given by:

$$r = \frac{-Z_1}{2Z_1 + Z_2}, \; b = \frac{2Z_2}{2Z_1 + Z_2}.$$

Thus, if it is desired that the reflected and the refracted portion cancel out each other, the requirement for the impedance ratio is $Z_1/Z_2=2$. For a 50Ω feeding line 1804 from the tester (or from output driver or output buffer 1802 of the tester) this means that the branch lines 1814, 1816 need to have an impedance of 100Ω. Interestingly, this also the matching condition for the signal that approaches the fork point. 1810 from the feeding line 1804, so that no energy is lost when driving into the fork 1410 for example from the feeding line 1804. An advantage of the Y-sharing is the symmetry. The symmetry ensures that (in an ideal case) all devices under test (DUTs) see the same signal. So, for example all device inputs are charged with the same signal rise time, which is not the case for the Daisy-Chain sharing. Furthermore, devices that have unequal input impedances on different pins (e.g., stacked die devices) can be tested easily with Y-sharing, since the propagation delay from the feeding point to the input pins of the shared pins are identical by design and the different input signals can be calibrated individually. This is not the case for Daisy-Chain sharing. Therefore, stacked die testing is not possible with the Daisy-Chain sharing approach, but with Y-sharing.

To summarize the above, under the conditions described for the impedances, a canceling of reflected and refracted signal portions can be obtained in the circuit shown in FIG. 18.

Theoretically, the simple conventional type of Y-sharing can also be expanded to a fan-out factor of 4. However, this idea can hardly be implemented in a realistic printed-circuit-board (PCB) process.

Figure 19:
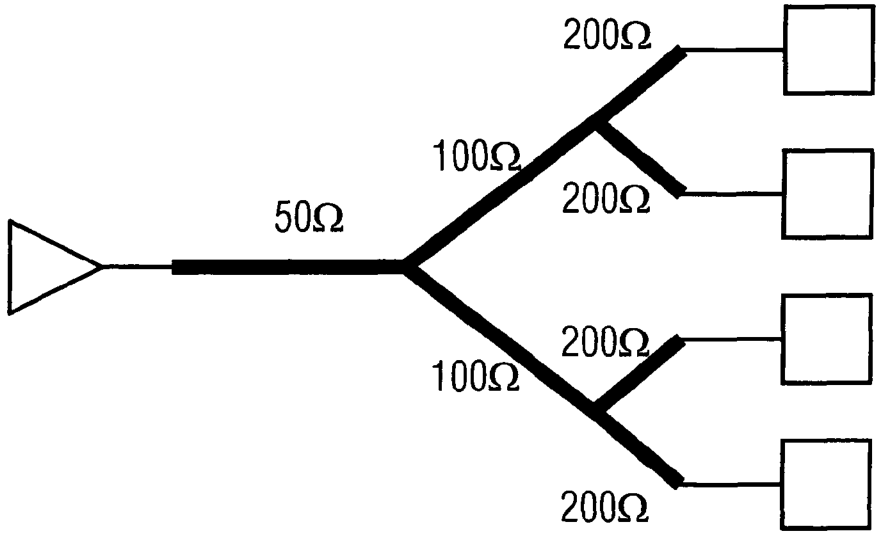
FIG. 19 shows a schematic diagram of a circuitry for a by-4 Y-sharing using a conventional approach.

FIG. 19 shows a schematic diagram of a conventional Y-sharing circuit with a fan-out factor of 4. Since the fan-out of 4 entails the manufacturing of a trace impedance of 200Ω, an extremely thick dielectric and an extremely small trace width may be chosen to get close to 200Ω (the open air impedance is 377Ω). Since a typical double data rate device (DDR device) has about 30 inputs that may be shared in this way, the socket board printed circuit board margin some cases get prohibitively thick, such that vias cannot be drilled safely anymore. Furthermore, a lot of cross talk may occur since the side walls of the high impedance traces are poorly shielded. Finally, the device input capacitance have to be charged from a 200Ω impedance, resulting in extremely slow signal transitions. From the above discussion, it can be seen that the theoretical circuitry for a by-4 Y-sharing using the conventional approach, which is shown in FIG. 19, is difficult to implement because of the high impedance trances, which would be useful.

In the following, some further embodiments according to the invention will be described. However, it should be noted that in some of the embodiments described in the following, a cancellation of reflected and refracted signal portions will also be exploited.

Figure 20:
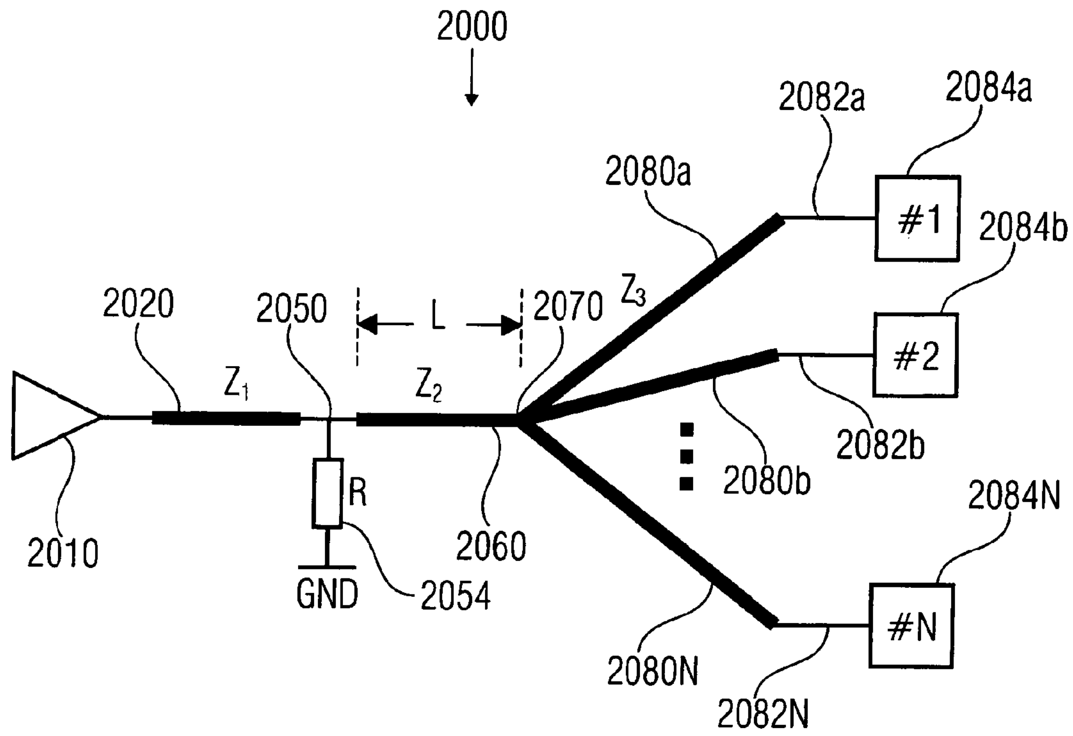
FIG. 20 shows a schematic diagram of a "laqi-b" approach for a Y-sharing with a fan-out of N.

FIG. 20 shows a schematic diagram of a so-called "laqi-b" approach for Y-sharing with a fan-out of N. The circuit shown in FIG. 2000 is designated in its entirety with 2000. The circuit 20 comprises a buffer or driver 2010, which may be equivalent to the buffer or driver 1310. The circuit 2000 further comprises a first transmission line 2020 which may be equivalent to the first transmission line 1320. The first transmission line 2020 may for example be circuited between the output of the buffer or driver 2010 and a fourth node or a branch node 2050. The first transmission line 2020 may for example comprise a characteristic impedance of $Z_1$. Moreover, the circuit 2000 may comprise a resistor 2054, which is circuited between the node 2050 and a fixed potential, for example a reference potential GND. The resistor 2054 may comprise a resistance of R.

The circuit 2000 further comprises an optional second transmission lines 2060, which may comprise an impedance of $Z_2$, and which second transmission line may be equivalent to the second transmission line 1360. The second transmission line 2060 is circuited between the node 2050 and a branch node or fork node 2070, which may for example be equivalent to the branch node or fork node 1370. However, in the absence of the second transmission line 2060, the node 2050 may coincide with the branch node or fork node 2070.

The circuit 2000 further comprises a plurality of N branch transmission line 2080*a* to 2080*n*, which branch transmission lines 2080*a* to 2080*n* may branch from the branch node or fork node 2070. Furthermore, the circuit 2000 may for example comprise N device-under-test connections 2082*a* to 2082*n*, which may for example be equivalent to the device-under-test connections 1382*a* to 1382*n*. Further, there may be a possibility to connect N devices-under-test 2084*a* to 2084*n* to the device-under-test connections 2082*a* to 2082*n*. For example, each of the branch transmission lines 2080*a* to 2080*n* may be associated with one device-under-test connection 2082*a* to 2082*n*, or with one device-under-test 2084*a* to 2084*n*. Thus, each of the branch transmission lines 2080*a* to 2080*n* may connect one of the device-under-test connections 2082*a* to 2082*n* with the branching node or fork node 2070. However, in some other embodiments, more than one device under test connection may be coupled to a single branching line.

The so-called new "laqi-b" approach for a by-N Y-sharing uses, at least partially, similar principles or even the same principles as the conventional approach to avoid reflections. This means, it is advantageous to design the branches absolutely symmetrical. Also, it is desired that the impedance ratio $Z_3/Z_2$ between the N branches and the feeding line may be chosen such that the reflected signal portions and the refracted signal portions cancel out each other (for example as described with reference to FIGS. 18 and 19).

However, it is the key idea of some embodiments of the present invention to add a so-called "fork resistor" having a resistance value R (for example, the resistor 2054), such that the useful trace impedances can be shifted into an impedance range, which is producible (or even producible with moderate effort) with standard printed circuit board processes.

The values for the so-called port resistor (resistor 2054) and the traced impedances may be chosen in the following way:

A desired characteristic impedance Z3 of the branch transmission line 2080*a* to 2080*n* may be given with $$0<Z_3<Z_1*N.$$

Consequently, the impedance Z2 of the second transmission line 2060 and the resistance R of the fork resistor 2054 may be chosen according to the following equation:

$$Z_2=Z_3/N; \text{ and}$$

$$R=(Z_1*Z_2)/(Z_1-Z_2).$$

A length L of the second transmission line 2060 may be chosen arbitrarily. In a special case, the length L may reach a value of 0, which means that the second transmission line 2060 can be omitted.

It should be noted here that naturally the impedance $Z_2$ of the second transmission line 2060 and the resistance R of the fork resistor 2054 may deviate from the ideal values defined by the above equations in accordance with acceptable tolerances. For example, a tolerance of +/−20% from the ideal desired values may be acceptable in some applications. In other applications, a maximum tolerance of, for example, +/−10% or +/−−5%, may be desirable.

Moreover, it should be noted that the value R of the resistance increases if the impedance value $Z_3$/N approaches the value of $Z_1$. However, in practical applications, it is typically desirable that $Z_3$/N differs from the impedance $Z_1$ by at least 20% or even by at least 50%. Accordingly, the resistance of the resistor 2054 is smaller than ten times the impedance $Z_1$. In many cases, the resistance R of the resistor 2054 is even smaller than the characteristic impedance $Z_1$.

Figure 21:
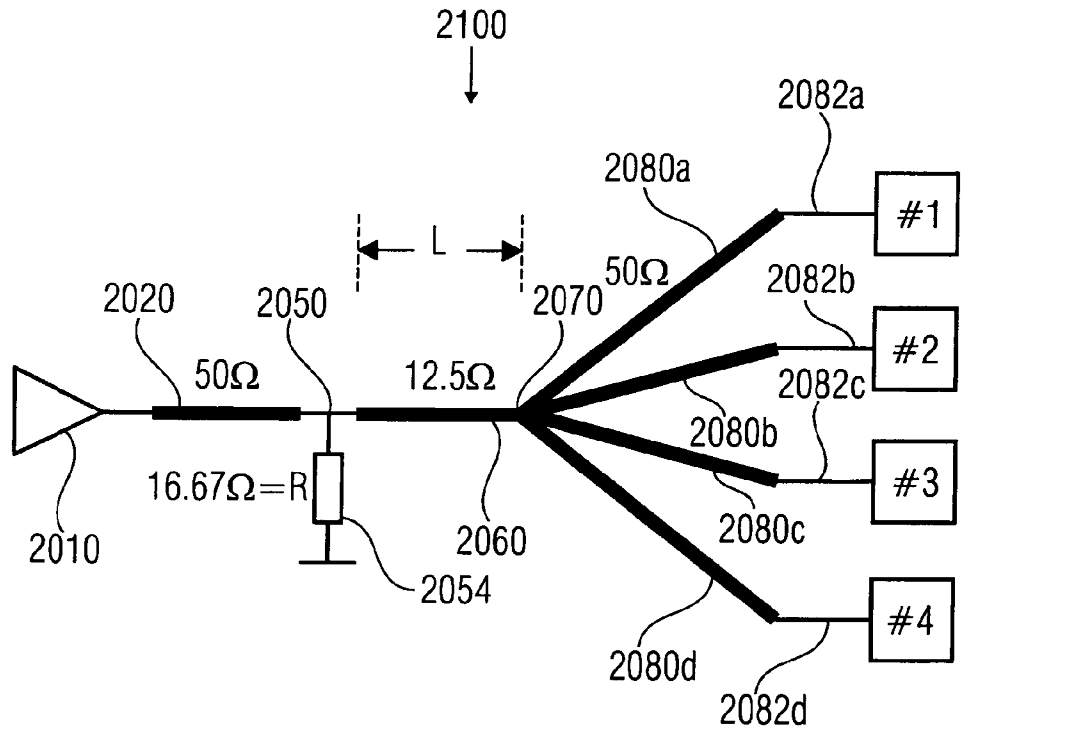
FIG. 21 shows a schematic diagram of a circuit for a by-4 "laqi-b" sharing using 50Ω branches and a fan-out of N=4.

In the following, some further embodiments will be described taking reference to FIGS. 21 and 22. FIG. 21 shows a schematic diagram of a circuit providing for a by-4 "laqi-b" sharing with 50Ω branches. The circuit shown in FIG. 21 provides for an fan-out of N=4. The circuit shown in FIG. 21 is designated in its entirety with 2100. The circuit 2100 is a special case of the general circuit 2000 shown in FIG. 20. The circuit 2100 comprises four device-under-test connections 2082*a* to 2082*d*. In the circuit 2100, the third transmission line 2020 comprises a characteristic impedance of approximately 50Ω. The fork resistor 2054 comprises a resistance of 16.67Ω. The second transmission line 2060 comprises a characteristic impedance of 12.5Ω, and the branch transmission lines 2080*a* to 2080*d* each comprise a characteristic impedance of 50Ω. Naturally, typical tolerances of +/−20%, or of +/−10%, are acceptable in many cases. In other words, the circuit 2100 represents a typical case for N=4 and $Z_1$=50Ω. For example, $Z_3$=50Ω, $Z_2$=12.5Ω and R=16.67Ω. That means that the whole circuitry 2100 can be fabricated with standard 50Ωstripline traces or microstripline traces, for which almost all printed circuit board manufactures provide ready-to-use design rules. A good automated test equipment driver rise time (for example, of the driver of a buffer 2010) is preserved, since the device-under-test input capacitances are charged from a 50Ω source impedance (the impedances of the branch transmission lines 2080*a* to 2080*d*). The setting 2100, however, has the disadvantage that it reduces the signal swing at the device-under-test to $Z_1/(Z_1+R)$=¼ of the programmed swing of the buffer or driver 2010.

To avoid the reduced swing disadvantage, the following setting can be used for N=4, $Z_1$=50Ω, $Z_3$=100Ω, $Z_2$=25Ω and R=500. The result is a swing identical to the by-4 Daisy-Chain sharing (½ of the programmed driver swing) and slightly increased rise times, since in this case, the device-under-test input capacitances are charged from a source impedance of 100Ω. Again, the trace segment (second transmission line) with $Z_2$=25Ωcan be omitted. However, a 100Ω trace impedance can still be produced reasonably in a state-of-the-art printed circuit board process.

Figure 22:
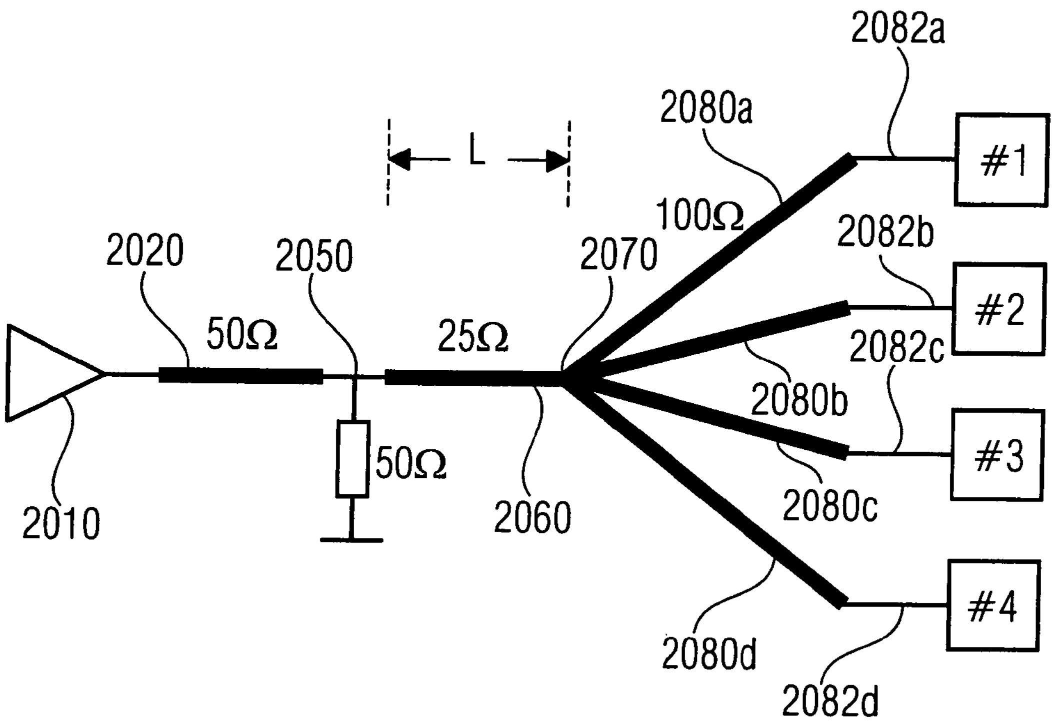
FIG. 22 shows a schematic diagram of a circuit for a by-4 "laqi-b" sharing with 100Ω branches.

FIG. 22 shows a schematic diagram of a circuit implementing this by-4 "laqi-b" sharing with 100Ω branches.

However, it should be noted that the impedance of the branch transmission lines 2080*a* to 2080*n* could be varied in accordance with the requirements. For example, branch impedances between 50Ω and 100Ω can be fabricated in a technologically advantageous way. However, in some printed circuit board processes, it is difficult to obtain transmission lines having an impedance as high as 100Ω. In such processes, it may be advantageous sometimes to use branch transmission lines having a characteristic impedance between 60Ω and 80Ω. Moreover, it should be noted that in some embodiments, it is desired to have a relatively high impedance of the branch transmission lines to obtain a large voltage swing at the device-under-test connections 2082*a* to 2082*n*. On the other hand, it is sometimes desired to keep the characteristic impedances of the branch transmission lines as low as possible in order to obtain short rise times of the edges arising at the device-under-test connections 2080*a* to 2080*n*. Thus, in some embodiments, the characteristic impedance of the branch transmission lines 2080*a* to 2080*n* will be chosen to obtain a trade-off between manufacturability, swing and rise times.

It should be noted here that a nominal impedance or desired impedance of the fork resistor 2054 depends on the characteristic impedance of the branch transmission lines, as described above.

Figure 23:
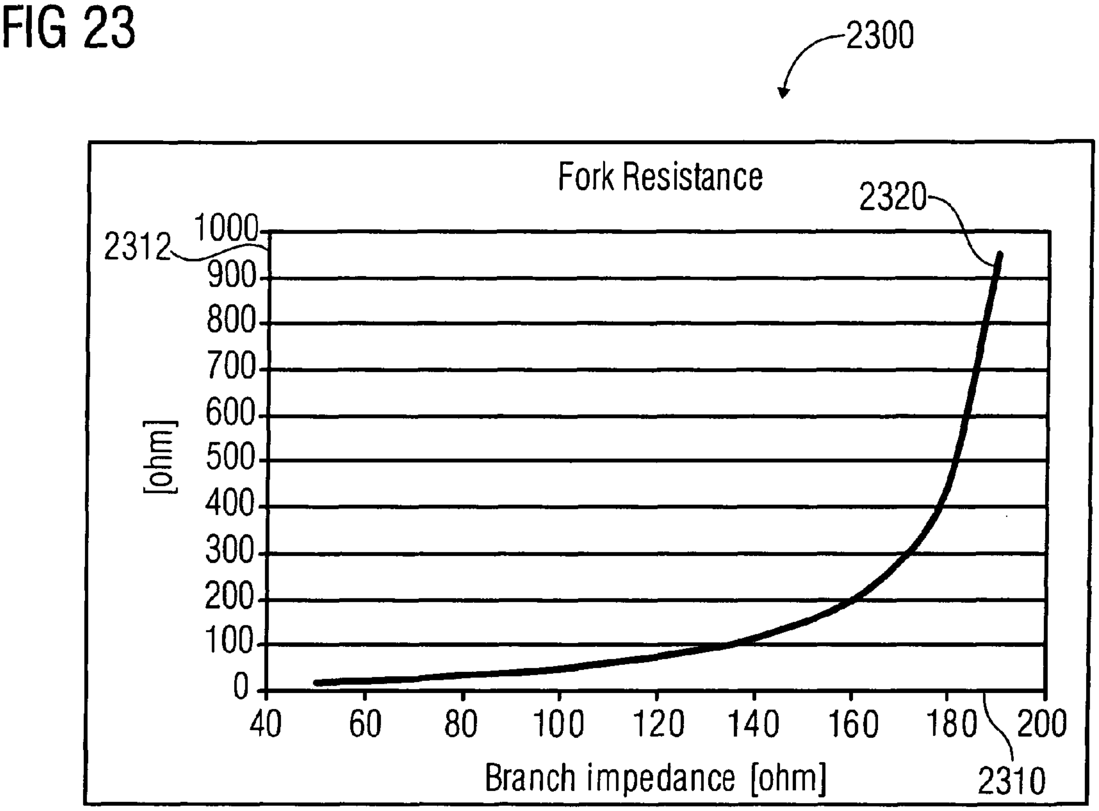
FIG. 23 shows a graphical representation of a relationship between a desired fork resistance value and a given branch impedance for a "laqi-b" sharing with a fan-out factor of 4.

FIG. 23 shows a graphical representation of a dependency between a characteristic impedance of the branch transmission lines 2080*a* to 2080*n* and a corresponding resistance of the branch resistor or fork resistor 2054. The graphical representation shown in FIG. 23 is designated in its entirety with 2300. The graphical representation 2300 describes a useful fork resistance value for a given branch impedance for a laqi-b sharing with a fan-out factor of 4. An abscissa 2310 describes the branch impedance in Ω, and an ordinate 2312 describes a useful value of the fork resistance 2054. A curve 2320 describes the useful fork resistance value as a function of the branch impedance for the by-4 sharing. It can be seen that reasonable values for the fork resistance are obtained for branch impedances between 50Ω and 190Ω. However, branch impedances below 50Ω could also be used, if desired.

Figure 24:
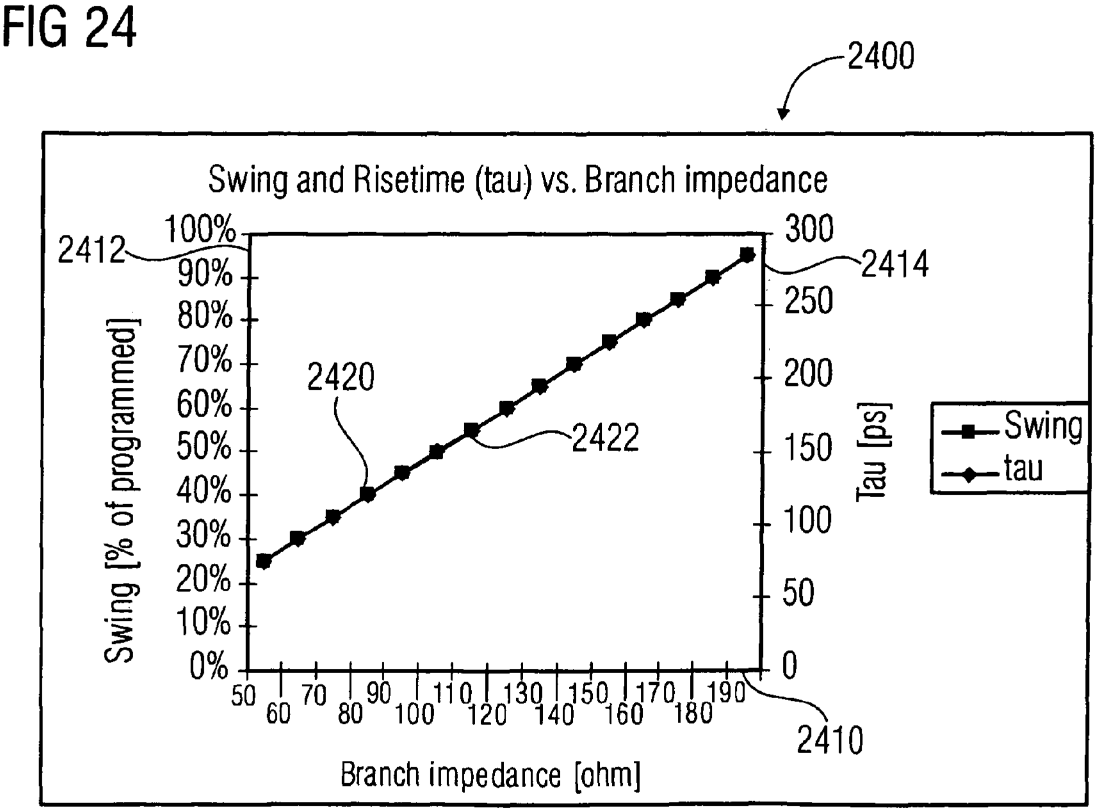
FIG. 24 shows a graphical representation of swing and rise time (TAU=$Z_3$×1.5 pF) as a function of the branch impedance for a by-4 "laqi-b" sharing.

FIG. 24 shows a graphical representation of a dependency of swing and rise times on the branch impedance. The graphical representation of FIG. 24 is designated in its entirety with 2400 and it depicts a swing and a rise time (TAU=$Z_3$×1.5 pF) as a function of the branch impedance for the by-4 "laqi-b" sharing. An abscissa 2410 describes the branch impedance in a range between 50Ω and 200Ω. A first ordinate 2412 describes a voltage swing at a device-under-test connection 2082A to 2082N in percent of a programmed voltage swing and a second ordinate 2414 describes a rise time of a signal arriving at the device-under-test connection 2082*a* to 2082*n*. Two approximately coincident curves 2420, 2422 describe the dependency of the swing on the branch impedance and the dependency of the rise time tau on the branch impedance. As can be seen from FIG. 24, the swing increases approximately linearly with the branch impedance. Similarly, the rise time increases approximately linearly with the branch impedance. Thus, the increase of the branch impedance brings along an increase of the swing (which is desired) and an increase of the rise time (which is not desired). Accordingly, by choosing the branch impedance, a reasonable compromise can be obtained in terms of swing and rise times.

Figure 25:
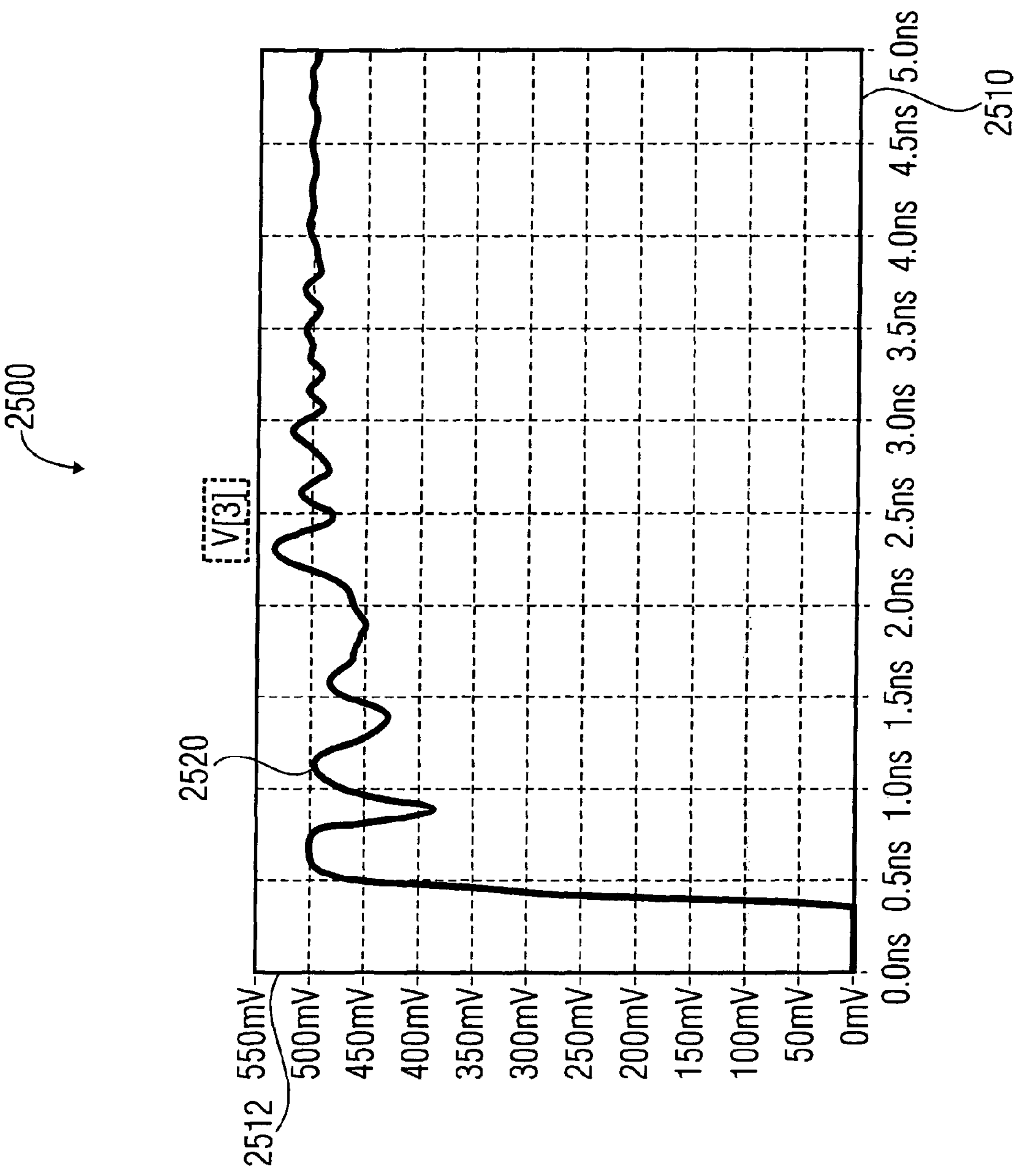
FIG. 25 shows a graphical representation of a step response at a first device-under-test (DUT 1) of a conventional by-4 Daisy-Chain sharing.
Figure 26:
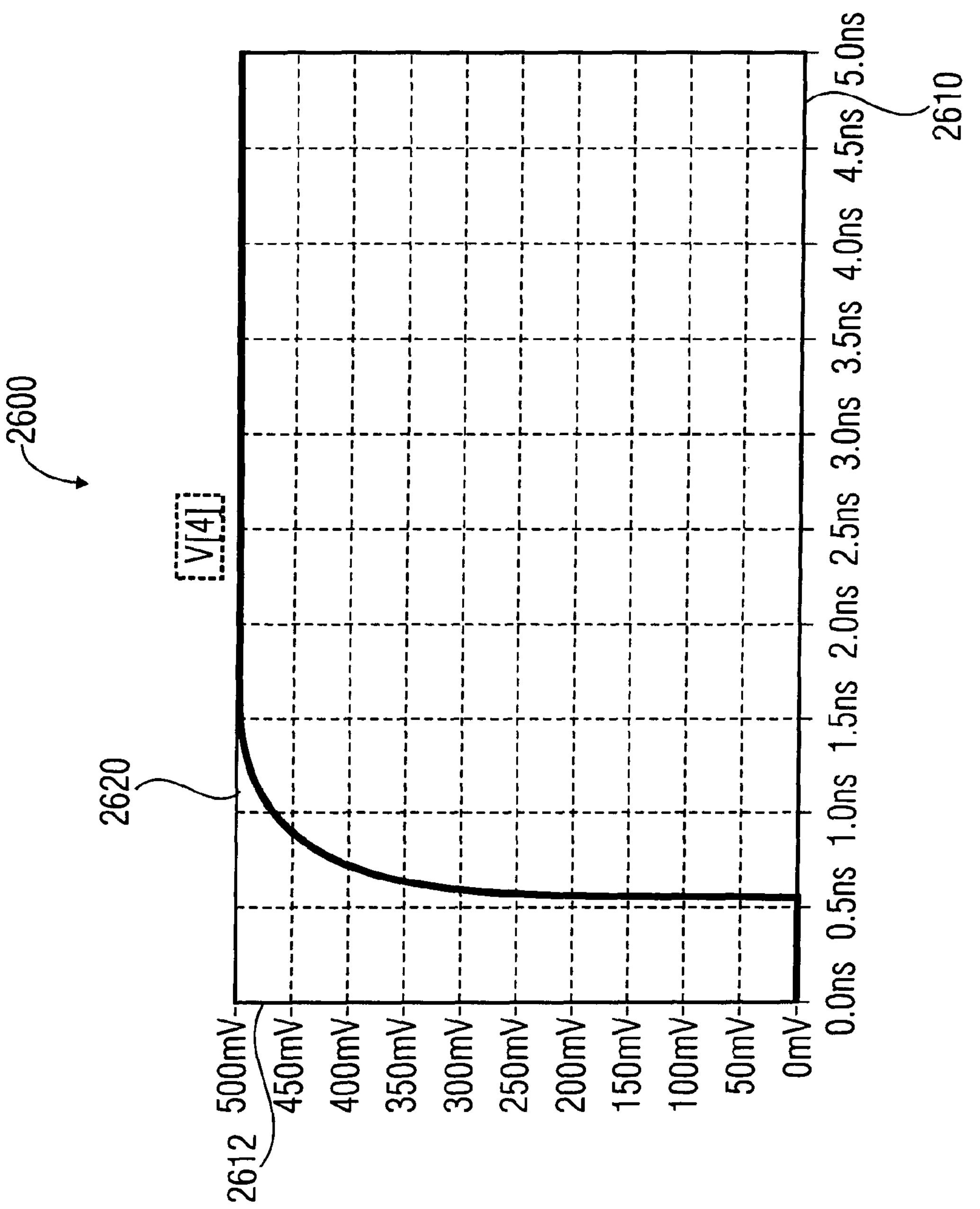
FIG. 26 shows a graphical representation of a step response at a first device-under-test (DUT1) of the "laqi-b" sharing by-4 with 100Ω branches.

In the following, simulation results will be described. FIGS. 25 and 26 show graphical representations of a simulation result of a loss less first-order spice simulation of the by-4 Daisy-Chain sharing approach and the by-4 "laqi-b" sharing approach with 100Ω branches, wherein a device-under-test input capacitance of 1.5 pF is assumed.

FIG. 25 describes a step response at a first device-under-test (DUT) of a conventional by-4 Daisy-Chain sharing. The graphical representation shown in FIG. 25 is designated in its entirety with 2500. An abscissa 2510 describes a time in a range between 0 and 5 nanoseconds and an ordinate 2512 describes a level at a device-under-test input in a range between 0 and 550 milli-volt. A curve 2520 describes the step response as a function of time.

FIG. 26 shows a graphical representation of a step response at a first device-under-test (DUT) of the above-described inventive laqi-b sharing by-4 with 100Ω branches (as shown in FIG. 22). The graphical representation of FIG. 26 is designated in its entirety with 2600. An abscissa 2610 describes a time in a range between 0 and 500 nanoseconds and an ordinate 2612 describes a voltage level at the input of the first device-under-test in a range between 0 and 500 milli volts. A curve 2620 describes a level at the input of the device-under-test as a function of time.

As can be seen from a comparison of FIGS. 25 and 26, the rise time of the signal is somewhat higher for the laqi-sharing by-4. The increase in the rise time is caused by the usage of branch transmission lines having an impedance of 100Ω. However, the ringing, which is apparent in the case of the by-4 Daisy-Chain sharing can be avoided (or at least reduced) using the laqi-b sharing by-4.

For the conventional Y-sharing limited to a fan-out of 2 as well as for the laqi-b sharing, it is desired to design the branches absolutely symmetrical (or at least approximately symmetrical) to exploit the reflection cancellation effect. Due to manufacturing limitations for the printed circuit board and input capacitance variations between the devices under test however, the theoretical symmetry (or the desired symmetry) not can be achieved completely. Therefore, the reflections will not be cancelled completely, resulting in remaining signal distortions.

A means to further reduce this effect is to introduce a complete or incomplete termination at the branch ends to reduce the initial reflections at the devices under test. The fact that the device-under-test input capacitance acts like a short circuit in the first instance of time, however, prevents a complete matching at the branch end. Therefore, the reflection cancellation effect at the fork point still remains important, and the requirement for a well chosen trace impedance ratio and the fork resistance for the laqi-b version of Y-sharing stays in place. Nevertheless, this type of termination not only improves the signal integrity, but also improves the rise time. The penalty, however, is that it reduces the swing again depending on what value is used for termination. A completely matched termination would reduce the swing to $1/N^{th}$ of the programmed driver level.

Figure 27:
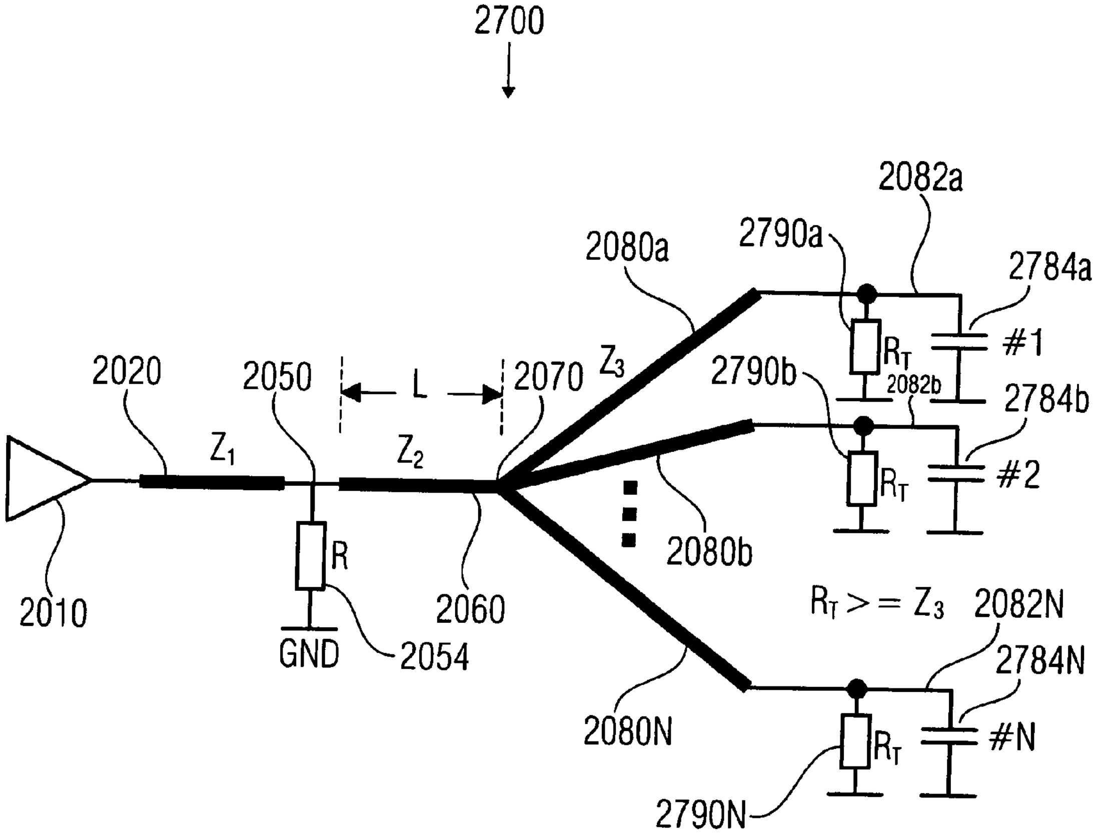
FIG. 27 shows a schematic diagram of a circuit for a terminated "laqi-b" sharing.

FIG. 27 shows a schematic diagram of a circuit comprising a terminated "laqi-b" sharing. The circuit shown in FIG. 27 is designated in its entirety with 2700. It should be noted that the circuit 2700 is very similar to the circuit 2000 shown in FIG. 20. Accordingly, identical means are designated with identical reference numbers. However, it can be seen that the devices under test 2084*a* to 2084*n* are replaced by capacitances 2784*a* to 2784*n* representing the input capacitance of the devices under test 2084A to 2084N. In other words, in a real circuit, the capacitances 2784A to 2784N would not be present as dedicated capacitances, but would rather be formed by the inputs of the devices under test. Further, the circuit 2700 comprises termination resistors 2790*a* to 2790*n*. For example, the first termination resistance 2790*a* is circuited between a device-under-test sided-end of the first branch transmission line 2080*a* and a termination potential, which may, for example, be a ground potential or reference potential GND (or which may be different from the reference potential GND). Similarly, the second termination resistance is circuited between the device-under-test sided-end of the second branch transmission line 2080*b* and a termination potential as shown. Thus, the device-under-test sided ends of the branch transmission lines 2080*a* to 2080*n* are terminated using the termination resistors 2790*a* to 2790*n*. Accordingly, reflections, which are caused by the input capacitances 2784*a* to 2784*n* of the devices under test are at least partially reduced by the termination resistors 2790*a* to 2790*n*.

As mentioned above, the termination resistors 2790*a* to 2790*n* will cause a termination of the branch transmission lines and, therefore, increase a matching. Accordingly, reflections at a test socket for a device under test or at an input of the device under test can be reduced. The resistance $R_T$ may, for example, be chosen to be larger than or equal to the characteristic impedance $Z_3$ of the branch transmission lines.

Figure 8B:
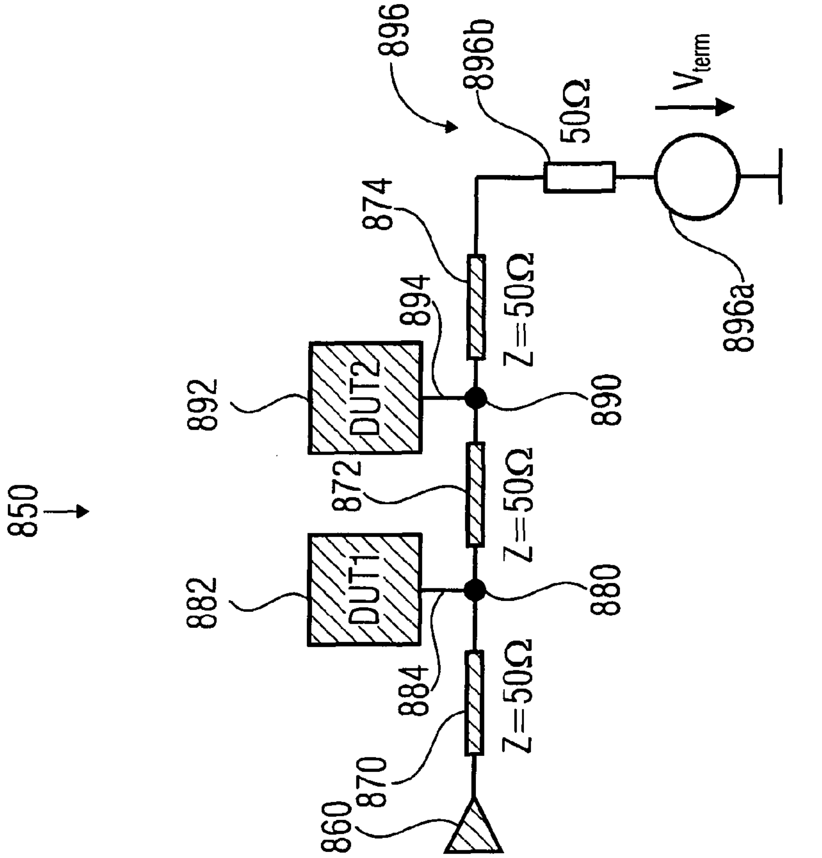
FIG. 8*b* shows a block schematic diagram of a conventional Daisy-Chain topology.
Figure 8A:
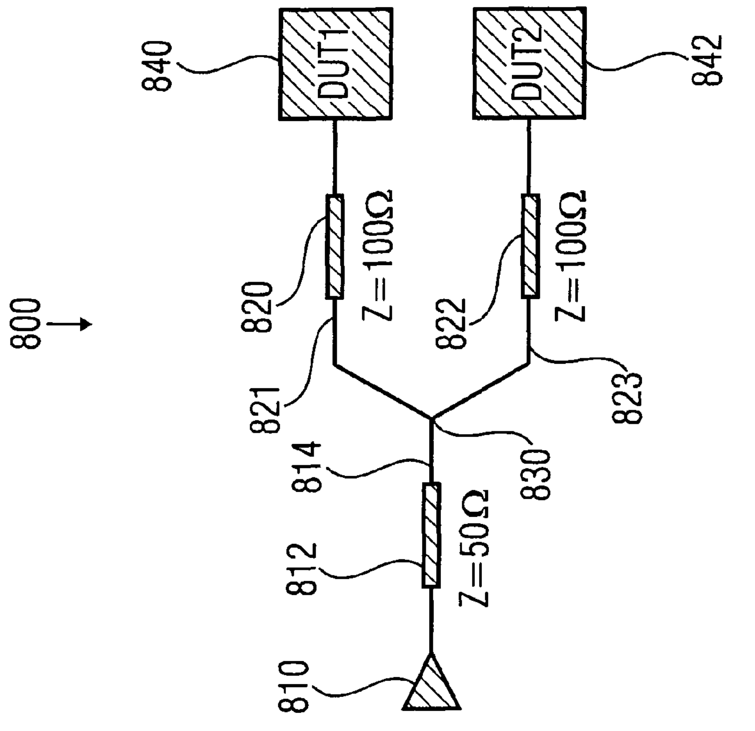
FIG. 8*a* shows a block schematic diagram of a conventional Y-sharing topology.
Figure 9:
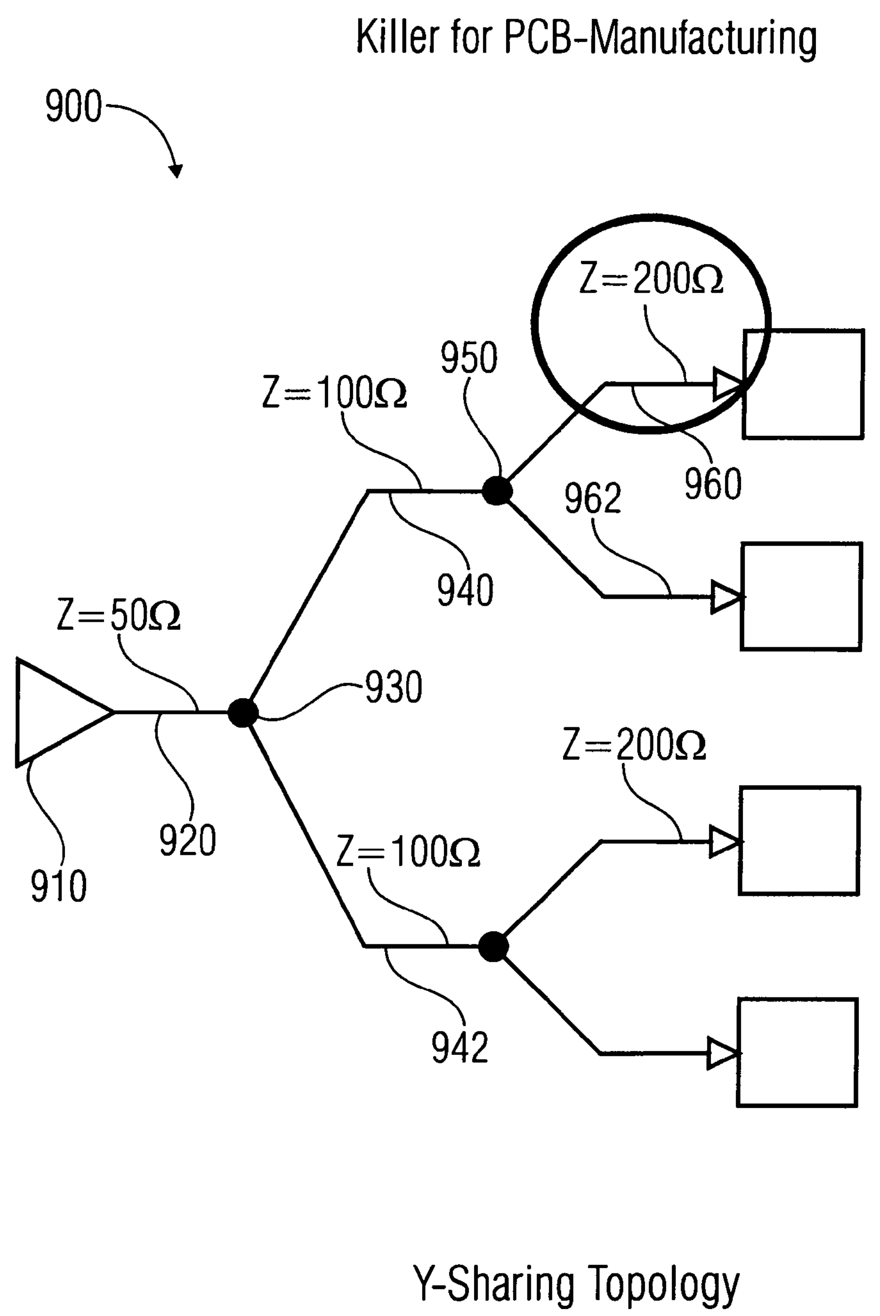
FIG. 9 shows a block schematic diagram of a Y-sharing topology.
Figure 10:
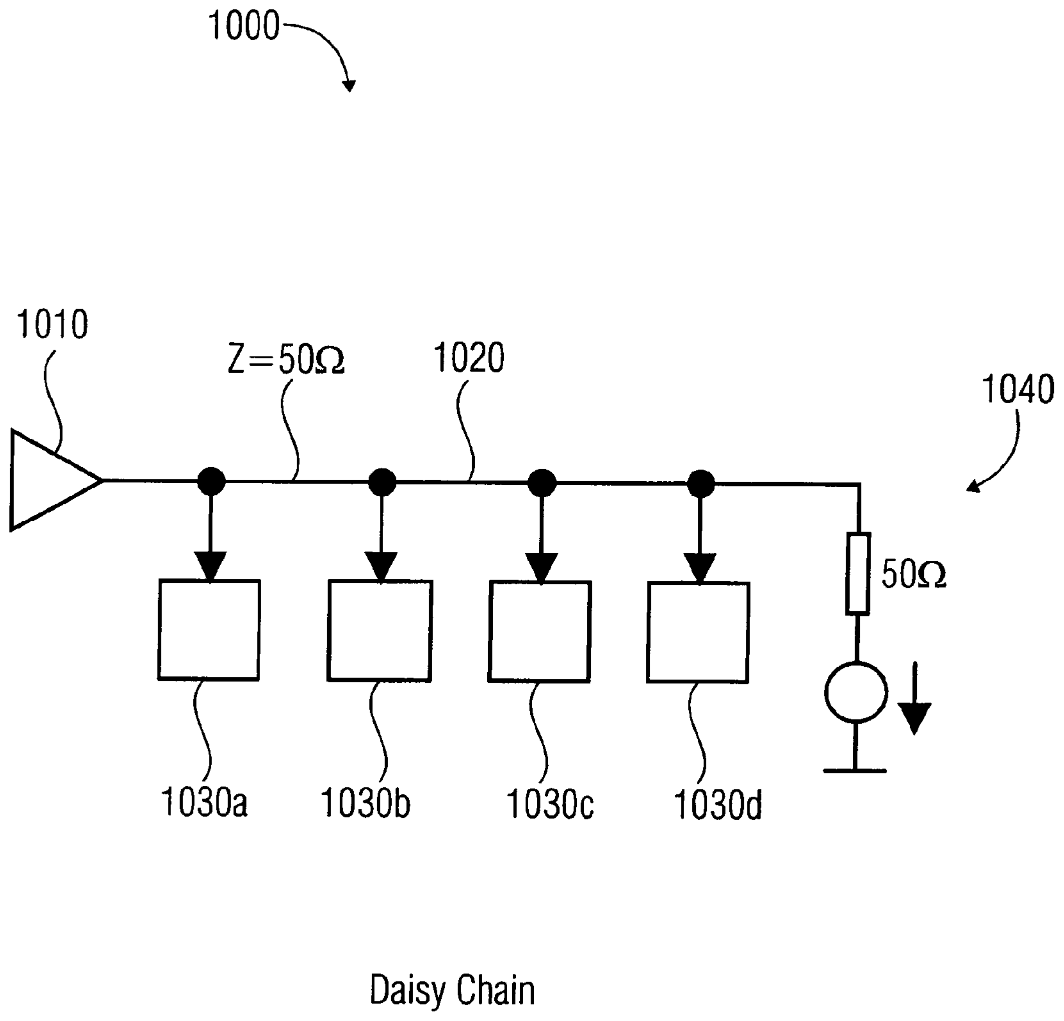
FIG. 10 shows a block schematic diagram of a Daisy-Chain topology.
Figure 11:
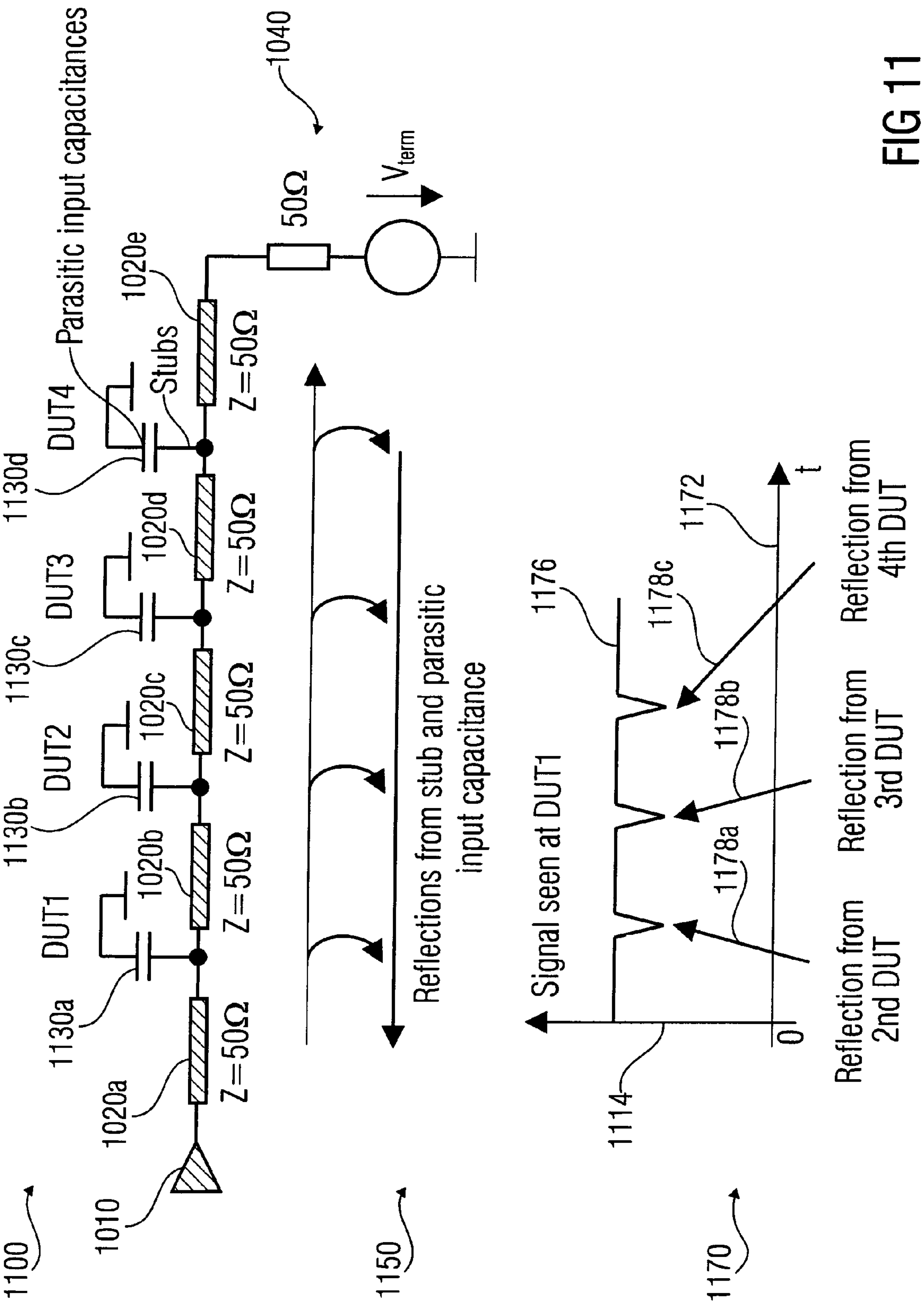
FIG. 11 shows an equivalent circuit of a Daisy-Chain topology and a representation of a signal degradation.
Figure 28:
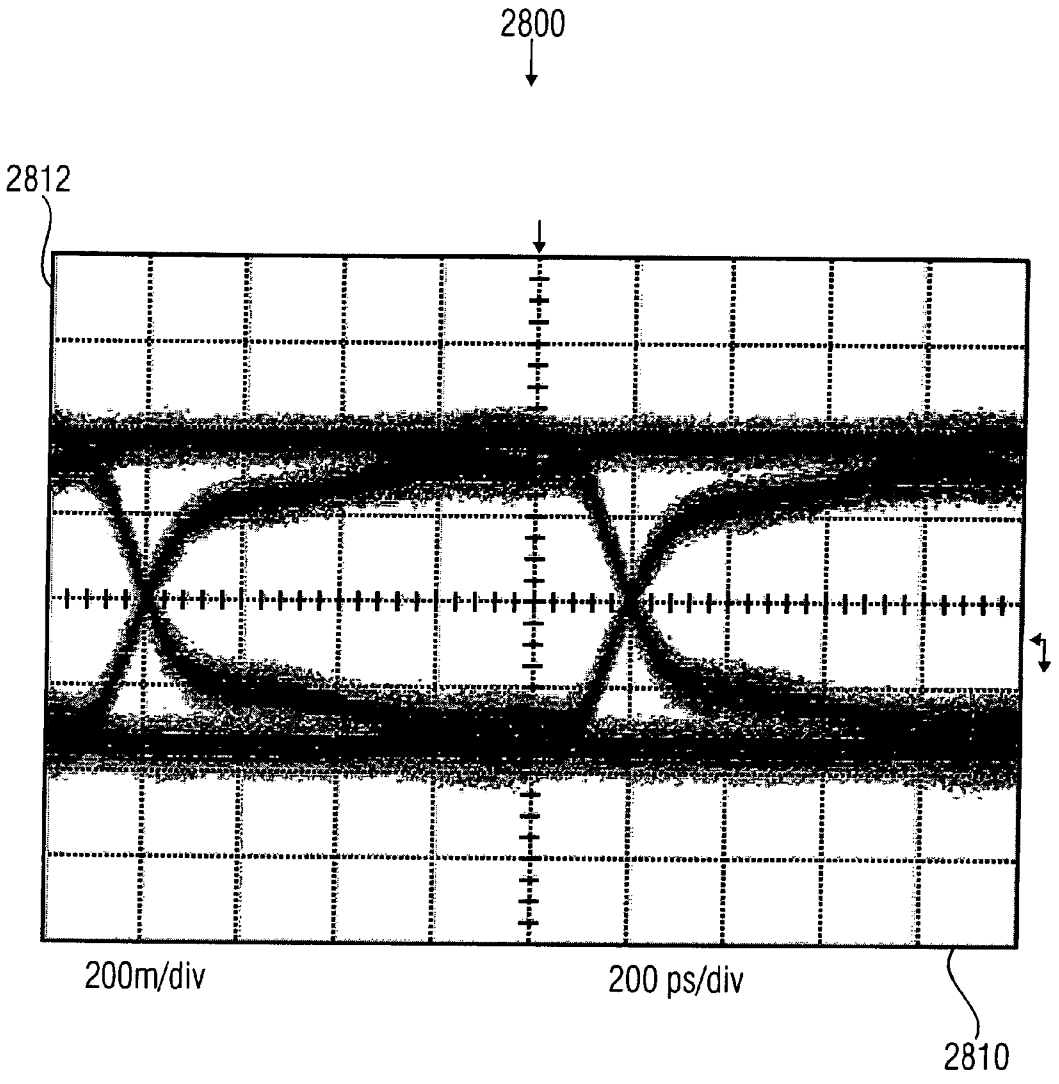
FIG. 28 shows an eye diagram for 1 Gbps data rate at a first device-under-test.

FIG. 28 shows a so-called "eye diagram" for a data rate of 1 Gigabit per second (Gbps) at a first device-under-test connection (for example at a device-under-test sided end of the first branch transmission line 1480*a*). The eye diagram of FIG. 28 is designated in its entirety with 2800. An abscissa 2810 describes a time, using a scaling of 200 ps/div. An ordinate 2812 describes a level, using a scaling of 200 mV/div. FIG. 8 shows that a sufficient eye opening can be achieved.

Embodiments according to the invention may for example be applied in high speed memory testing DDR2 devices. In some embodiments, data rates up to 1033 Mbps can be achieved. However, in further embodiments, even higher data rates may be achieved.

Some embodiments according to the invention can be applied for a multi-site testing. For example, a multi-site testing×64 may be performed. However, embodiments according to the invention can also be applied in a multi-site testing having lower or even higher sharing factors. In some embodiments, a plurality of socket boards (for example 16 socket boards) can be used, each of the socket boards providing a device-under-test socket for two or more devices (for example for two or four devices).

Some embodiments according to the invention can be applied in a multi-site testing×128. For example, 32 socket boards may be used in combination with a by-4 sharing. The multi site testing may run up to 2.5 Gbps. A new laqi-b sharing concept may contribute in achieving these goals.

Figure 29:
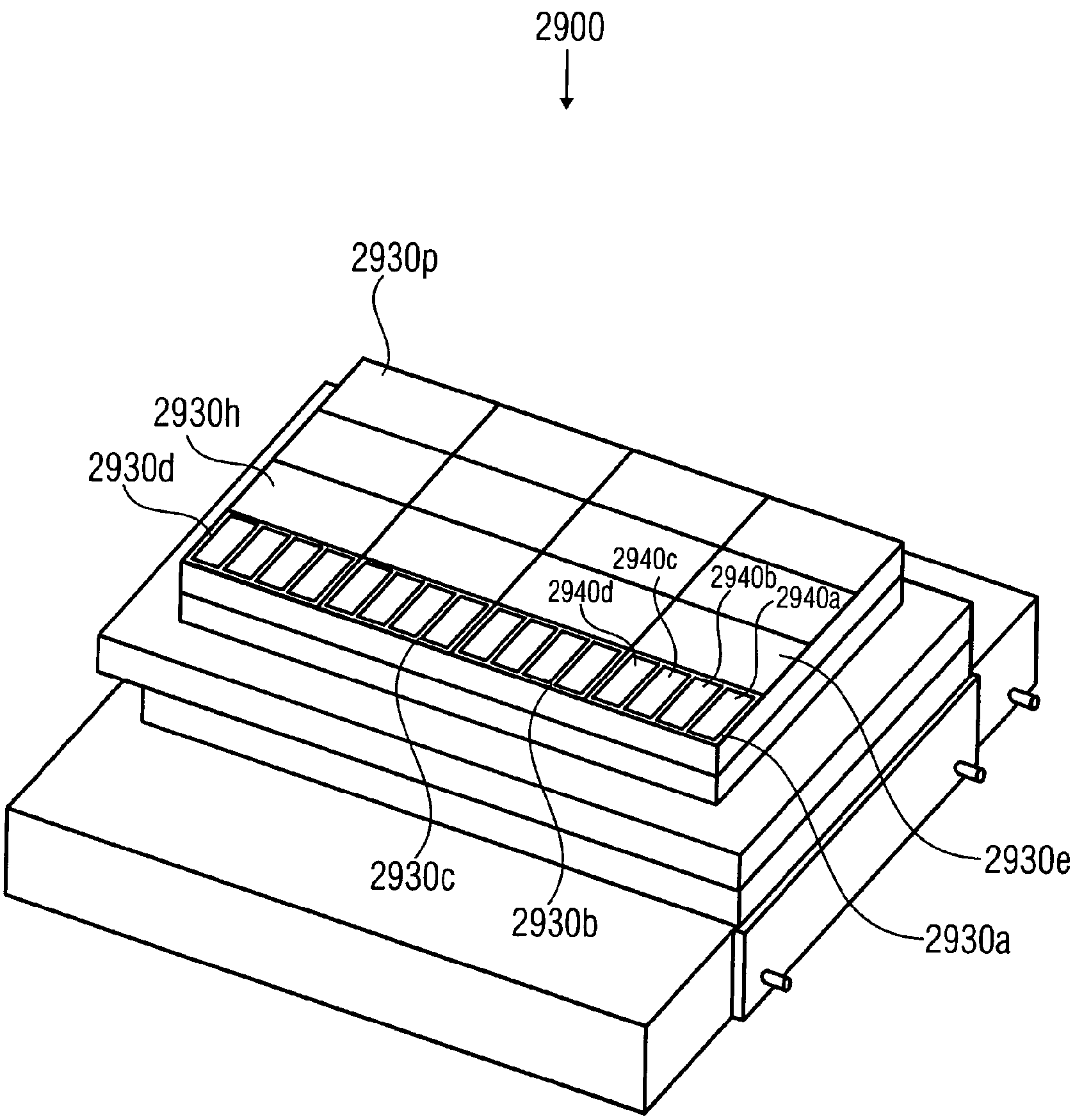
FIG. 29 shows a graphical representation of a multi-site testing interface, in which the "laqi-b" sharing can be applied.

FIG. 29 shows a schematic representation of a test adapter configured to interface a device-under-test interface of a chip tester to a device-under-test. The test adapter shown in FIG. 29 is designated in its entirety with 2900. The test adapter 2900 is configured to be attached to a test head of a device tester. Connections may be arranged on a lower surface of the test adapter (not shown in FIG. 29) which may interact, for example, with POGO pins of a device-under-test interface of a test head of a device tester. Moreover, the test adapter 2900 may provide connections to which individual test socket modules can be connected. For example, the tester 2900 may comprise 16 such connections arranged in a grid, to allow for an attachment of 16 socket modules. The socket modules 2930*a* to 2930*p* may be configured to distribute signals received from corresponding connections of the test adapter 2900 to the individual device-under-test sockets 2940*a* to 2940*d*. For example, a signal received from an individual pin of a socket module connection may be distributed to a plurality of the test sockets 2940*a* to 2940*b* using the laqi-sharing described herein. Thus, the laqi-sharing may be applied directly on the individual test socket modules. However, in some other embodiments, the laqi-sharing may be applied within the test adapter, for example between a test head connection of the test adapter and the test socket module connections.

The test adapter 2900 may for example be applied as a complete DDR2 interface for multi-site testing×64 using a laqi-sharing with a fan-out-factor of 2 or with a fan-out-factor of 4.

In some systems, the case N=2 is an advantageous embodiment. In some other systems, the case N=4 is an advantageous embodiment. However, other values for N can be used, in dependence on the specific requirements.

In some embodiments, the branch point 214 is a via designed with high diligence or accurateness to have good symmetry. Otherwise (in the absence of good symmetry), there may be signal distortions, which may be tolerable in some cases, and which may need to be avoided in some other cases.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A signal distribution structure for distributing a signal to a plurality of device connections, the signal distribution structure comprising:

a first signal guiding structure comprising a first characteristic impedance;

a node, wherein a first transmission line of the first signal guiding structure is coupled to the node;

a second signal guiding structure comprising one or more transmission lines circuited between the node and a branch point, wherein the one or more transmission lines of the second signal guiding structure are coupled between the node and the plurality of device connections, and wherein the second signal guiding structure comprises, side-viewed from the node, a second characteristic impedance which is lower than the first characteristic impedance; and a matching element connected to the node;

wherein the matching element is configured to match an impedance at the node, side-viewed from the second signal guiding structure, to the second impedance, and to increase a mismatch between an impedance at the node, side-viewed from the first signal guiding structure, and the first impedance; and a plurality of Y-sharing branches branching from the branch point, wherein impedances of the single Y-sharing branches deviate from the impedance of the first signal guiding structure by no more than 30% of the impedance of the first signal guiding structure, and wherein the impedance of the second signal guiding structure is matched to a joint impedance of the Y-sharing branches, such that the impedance of the second signal guiding structure is smaller than the impedance of the first signal guiding structure.

2. The signal distribution structure according to claim 1, wherein the second signal guiding structure comprises a single second transmission line.

3. The signal distribution structure according to claim 1, wherein the first impedance is within a range between 30Ω and 70Ω.

4. The signal distribution structure according to claim 1, wherein the impedances of the Y-sharing branches are within a range between 30 Ohm and 70 Ohm.

5. The signal distribution structure according to claim 1, wherein the matching element comprises a resistor connected to the node.

6. The signal distribution structure according to claim 1, wherein the matching element is connected between the node and a constant-potential node.

7. The signal distribution structure according to claim 1, wherein the matching element is connected between the node and a power supply configured to bias the node.

8. The signal distribution structure according, to claim 1, wherein the first signal guiding structure, the node, the second signal guiding structure and the device connection are arranged on a device-under-test board for usage in a device tester.

9. The signal distribution structure according to claim 1, wherein the first transmission line of the first signal guiding structure is coupled to the node via a connection element of the first signal guiding structure.

10. The signal distribution structure according to claim 9, wherein the connection element comprises a via coupled to the node and a pin coupled to the first transmission line, wherein the pin is arranged to detachably contact the via.

11. The signal distribution structure according to claim 9, wherein the node and the second transmission structure are arranged on a device-under-test board.

12. The signal distribution structure according, to claim 1, wherein the signal distribution structure comprises a matched driver;

wherein the first transmission line is circuited between an output of the matched driver and the node; and wherein an output impedance of the matched driver is matched to an impedance of the first transmission line.

13. The signal distribution structure according to claim 1, wherein the impedance of the first signal guiding structure is in the range between 40 Ohm and 60 Ohm.

14. The signal distribution structure according to claim 1, wherein the signal distribution structure is configured to provide a common input signal generated by a driver to a plurality of devices via the first signal guiding structure via the node and via the second signal guiding structure.

15. The signal distribution structure according to claim 1, wherein the signal distribution structure is configured such that a reflected signal, traveling towards the node via the second signal guiding structure, is absorbed in the matching element, or in a termination of the first signal guiding structure.

16. A signal distribution structure for distributing a signal to a plurality of device connections, the signal distribution structure comprising:

a first signal guiding structure comprising a first characteristic impedance;

a node, wherein a first transmission line of the first signal guiding structure is coupled to the node;

a second signal guiding structure comprising one or more transmission lines and a plurality of Y-sharing branches;

wherein the one or more transmission lines of the second signal guiding structure are coupled between the node and the plurality of device connections, wherein the second signal guiding structure comprises, side-viewed from the node, a second characteristic impedance which is lower than the first characteristic impedance;

wherein the plurality of Y-sharing branches are connected to the node; and wherein a joint impedance of the Y-sharing branches, side-viewed from the node, is smaller than the impedance of the first transmission line; and a matching element connected to the node;

wherein the matching element is configured to match an impedance at the node, side-viewed from the second signal guiding structure, to the second impedance, and to increase a mismatch between an impedance at the node, side-viewed from the first signal guiding structure, and the first impedance.

17. The signal distribution structure according to claim 16, wherein the impedance of the first transmission line is within a range between 30Ω and 70Ω; and wherein impedances of the single Y-sharing branches are within a range between 30Ω and 70Ω.

18. The signal distribution structure according to claim 16, wherein the impedances of the single Y-sharing branches deviate from the impedance of the first transmission tine by no more than 30% of the impedance of the first transmission line.

19. A signal distribution structure for distributing a signal to a plurality of device connections, the signal distribution structure comprising:

a first signal guiding structure comprising a first characteristic impedance;

a node, wherein the first signal guiding structure is coupled to the node;

a second signal guiding structure comprising one or more transmission lines, wherein the one or more transmission lines of the second signal guiding structure are coupled between the node and the plurality of device connections, and wherein the second signal guiding structure comprises, side-viewed from the node, a second characteristic impedance which is lower than the first characteristic impedance; and a matching element connected to the node;

wherein the matching clement is configured to match an impedance at the node, side-viewed from the second signal guiding structure, to the second impedance, and to increase a mismatch between an impedance at the node, side-viewed from the first signal guiding structure, and the first impedance; and wherein the node is formed using a branch via extending vertically through a multi-layer printed circuit hoard, and using a signal splitting structure, wherein the first signal guiding structure is coupled to a first end of the branch via, wherein the matching element is coupled to a second end of the branch via, wherein the signal splitting structure is formed in a conductive layer of the multi-layer printed circuit board, wherein the signal splitting structure is coupled to the branch via between the first end of the branch via and the second end of the branch via, and wherein the signal splitting structure is configured to spread the signal from the via to a plurality of branch transmission lines.

20. The signal distribution structure according to claim 19, wherein a first of the branch transmission lines and a second of the branch transmission lines are arranged on different layers of the multi-layer print circuit board, wherein the signal splitting structure is arranged on another layer of the multi-layer printed circuit board, which other layer is arranged between the layers in which the branch transmission lines are routed.

21. The signal distribution structure according to claim 20, wherein the first branch transmission line and the second branch transmission line are coupled to the signal splitting structure using vias extending through the multi-layer printed circuit board.

* * * * *